United States Patent
Fleischer et al.

(10) Patent No.: US 10,302,703 B2
(45) Date of Patent: May 28, 2019

(54) LITHIUM-ION BATTERY SAFETY MONITORING

(71) Applicant: ALGOLION LTD., Rehovot (IL)

(72) Inventors: Niles Fleischer, Rehovot (IL); Alex Nimberger, Kiryat Ono (IL)

(73) Assignee: Algolion Ltd., Rehovot (IL)

( * ) Notice: Subject to any disclaimer, the term of this patent is extended or adjusted under 35 U.S.C. 154(b) by 0 days.

(21) Appl. No.: 15/740,631

(22) PCT Filed: Jul. 6, 2016

(86) PCT No.: PCT/IL2016/050720
§ 371 (c)(1),
(2) Date: Dec. 28, 2017

(87) PCT Pub. No.: WO2017/006319
PCT Pub. Date: Jan. 12, 2017

(65) Prior Publication Data
US 2018/0196107 A1    Jul. 12, 2018

(30) Foreign Application Priority Data
Jul. 8, 2015   (IL) .......................................... 239852

(51) Int. Cl.
*G01R 31/36* (2019.01)
*G01R 31/02* (2006.01)

(52) U.S. Cl.
CPC ....... *G01R 31/3624* (2013.01); *G01R 31/025* (2013.01); *G01R 31/3651* (2013.01); *G01R 31/3662* (2013.01); *G01R 31/3679* (2013.01)

(58) Field of Classification Search
CPC .............. G01R 31/025; G01R 31/3624; G01R 31/3631; G01R 31/3651; G01R 31/3662; G01R 31/3679
(Continued)

(56) References Cited

U.S. PATENT DOCUMENTS 4,725,784 A    2/1988   Peled et al.
5,049,803 A    9/1991   Palanisamy
(Continued)

FOREIGN PATENT DOCUMENTS

WO    WO 2004/106946 A2    12/2004
WO    WO 2010/016647 A1    2/2010

OTHER PUBLICATIONS

International Search Report issued in corresponding International Patent Application No. PCT/IL2016/050720.
(Continued)

*Primary Examiner* — John H Le
(74) *Attorney, Agent, or Firm* — Finnegan, Henderson, Farabow, Garrett & Dunner LLP

(57) ABSTRACT

Method and system for monitoring the safety of a rechargeable Li-ion battery (LIB). An initial electrical state of the LIB is determined and altered by application or removal of DC electrical stimulus to trigger a time-varying response. The time-varying response of the LIB is measured, and at least one primary response parameter associated with the functional form of the measured response is extracted. At least one secondary response parameter is derived from the primary response parameter. A composite response parameter may be further derived from the primary response parameter and secondary response parameter. A likelihood of a short circuit precursor condition is determined in accordance with the primary response parameter, secondary response parameter and/or composite response parameter. Based on the determined likelihood, an alert of a potential short circuit derived hazard may be provided and/or a corrective measure to mitigate or prevent a short circuit derived hazard may be implemented.

18 Claims, 9 Drawing Sheets

(58) Field of Classification Search
USPC .......... 702/63, 109, 130; 320/123, 132; 324/426; 429/50; 713/300
See application file for complete search history.

(56) References Cited

U.S. PATENT DOCUMENTS

| | | |
|---|---|---|
| 7,202,632 B2 | 4/2007 | Namba |
| 7,433,794 B1 | 10/2008 | Berdichevsky et al. |
| 8,269,502 B2 | 9/2012 | Desprez et al. |
| 8,880,913 B2 | 11/2014 | Holsen et al. |
| 2003/0206021 A1* | 11/2003 | Laletin .............. G01R 31/3631 324/426 |
| 2006/0190204 A1 | 8/2006 | McHardy et al. |
| 2012/0182021 A1 | 7/2012 | McCoy et al. |
| 2013/0141109 A1 | 6/2013 | Love et al. |
| 2016/0006081 A1* | 1/2016 | Eaglesham ............. H01M 4/58 429/50 |

OTHER PUBLICATIONS

Written Opinion of the International Searching Authority issued in corresponding International Patent Application No. PCT/IL2016/050720.

* cited by examiner

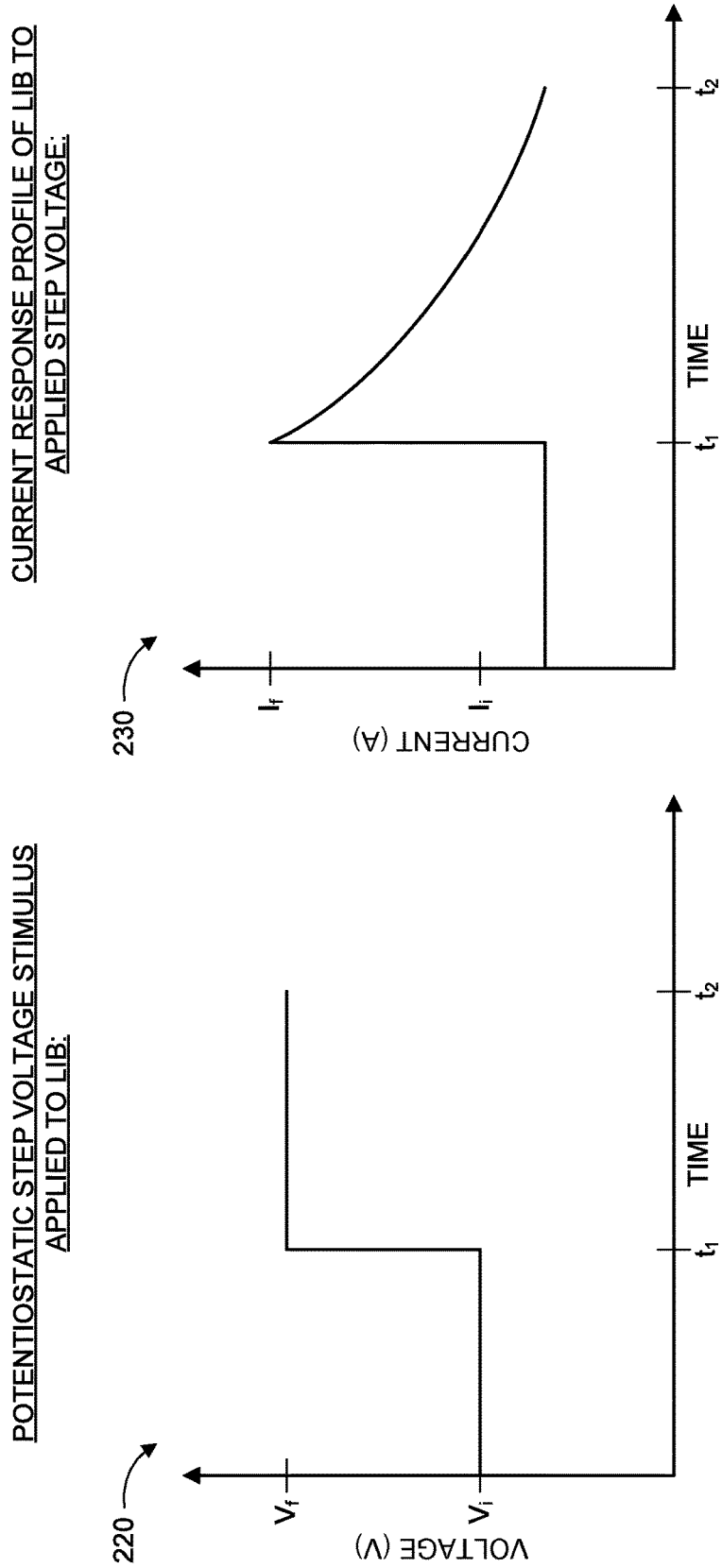

LITHIUM-ION BATTERY SAFETY MONITORING

CROSS-REFERENCE TO RELATED APPLICATIONS

This application is a National Phase application filed under 35 U.S.C. § 371 of PCT International Application No. PCT/IL2016/050720 with an International Filing Date of Jul. 6, 2016, which claims priority to Israel Patent Application No. 239852, filed on Jul. 8, 2015, the entire contents of which are incorporated herein by reference.

FIELD OF THE INVENTION

The present invention relates to batteries and consumer safety in general, and to diagnostic tools for monitoring the safety of lithium-ion batteries in particular.

BACKGROUND OF THE INVENTION

A lithium-ion battery (LIB) is a type of rechargeable battery commonly used in consumer electronics products. The positive electrode (cathode) of the LIB includes typically a lithium intercalation compound and the negative electrode (anode) is made with graphite, such that lithium ions flow from the positive electrode to the negative electrode when charging and in the reverse direction when discharging. LIBs are characterized by very high energy density relative to other types of rechargeable batteries, for example more than double that of some nickel-metal hydride cells. LIBs are also valued for their high power density, good performance over a broad range of temperatures, and low self-discharge rate. Moreover, LIBs are fairly adaptable for use in a variety of cell designs and configurations (e.g., prismatic, cylindrical, flat, coin or pouch designs), as well as with both liquid organic electrolytes and polymer electrolytes.

However, LIBs also possess a significant shortcoming in that they are occasionally prone to catching fire. These fires are typically caused by internal short circuits that can develop from an accumulation of latent defects and/or operational defects. Latent defects may involve the presence of contaminants, or manufacturing deficiencies, such as contact that could develop between the anode and the cathode or their respective current collectors. Operational defects may include, for example: the growth of lithium dendrites caused by lithium metal plating in the LIB during use (or the lithium plating itself); the growth of copper dendrites caused by copper plating (or the copper plating itself); and tears or holes formed in the separator due to physical or thermal stresses that create an opportunity for the anode and cathode to come into physical contact. Short circuits in the LIB cell may also result from degradation and environmental effects, such as physical impacts (e.g., falls or vibrations), large swings in temperature, impact shocks, and the like. A short circuit can trigger a chain reaction in the battery chemicals in the cell, leading to rapid temperature increase and a consequent buildup of pressure in the cell, causing it to rupture or combust. The heat may subsequently cascade to other battery cells, causing the entire battery to explode or go up in flames.

When a short circuit develops, internal LIB cell temperatures can rise in just a matter of seconds to unsafe levels, thereby inducing thermal runaway and consequent combustion. As LIBs are more reactive and have poorer thermal stability compared to other types of batteries, they are more susceptible to thermal runaway in certain conditions such as high temperature operation (e.g., above 80° C.) or overcharging (e.g., high rate charge at low temperatures). At elevated temperatures, cathode decomposition produces oxygen which reacts exothermically with organic material in the battery cell (e.g., flammable organic solvent electrolyte and carbon anode). The highly exothermic chain reaction is extremely rapid and can induce thermal runaway and reach excessive temperatures and pressures (e.g., 700° C. to 1000° C. and about 500 psi) in only a few seconds. Once the chain reaction begins it cannot effectively be stopped, and thus preventing this chain reaction from starting in the first place is crucial for preventing personal injury and property damage, as well as for maintaining battery operation.

In simplified terms, an initial internally developed fault or defect in a LIB cell can trigger a short circuit, which in turn elicits heating and subsequently exothermic chain reactions, leading to thermal runaway and ultimately combustion/explosion.

Charging at overly high voltages or low temperatures and/or charging too quickly can lead to the formation of lithium dendrites on the anode, which can elicit short circuiting (by dendrite penetration of the separator and cathode contact, and/or mechanical stresses of the electrodes). Conversely, discharging at too low a voltage can prompt copper dendrite growth (i.e., where copper is present in the anode current collector), which can also cause short circuiting. Cell heating from high environmental temperatures, rapid charging, high load discharging, and proximity between neighboring cells in a battery package, are all factors that increase the potential for thermal runaway.

Serious safety hazards are thus posed by a wide range of LIB containing devices and components, ranging from laptops and cellphones to electric/hybrid vehicles and aircrafts, with dangerous incidents reported yearly and numerous product recalls. The risk of such incidents is rising as the demands on the performance and size of cell and battery package increases, their energy density becomes greater, and LIBs grow more prevalent in additional commercial products with greater public exposure. Combustion of LIB cells may occur even under normal use, without any prior warning, and may have catastrophic implications in some cases. Consequently, many manufacturers avoid the use of LIBs altogether, leading to, for example, a substantial portion of electric vehicles and hybrid vehicles nowadays not being powered by LIBs, despite their numerous advantages.

Currently available battery diagnostic tools are essentially reactive systems which passively detect or monitor particular cell parameters, and may be ineffective (or insufficiently effective) in identifying potential hazards in advance, and thus in preventing the LIB cell from catching fire. Existing diagnostic approaches generally measure the routine operating current and voltage, and sometimes also the resistance and/or impedance, and perhaps the temperature, of the cell or battery. Certain methods rapidly interrupt the LIB charge/discharge current to the open circuit mode (e.g., a short duration of tens of microsceconds to capture the nearly instantaneous change in cell voltage), and then resume the charge/discharge to determine cell capacity, ohmic resistance and state of charge. Some manufacturers incorporate protection mechanisms for LIBs at the cell or battery package level to protect against over-charging, over-discharging, overheating, short-circuiting or other potentially dangerous circumstances. Some mechanisms may terminate the battery current if certain operating limits are exceeded. Nevertheless, the reaction time of such reactive regulation systems is generally insufficient to prevent the development of thermal runaway and the inevitable battery combustion that follows. In particular, conventional systems typically track only the temperature and cell operating voltage and current (and sometimes the AC impedance), all of which only depict changes that become significantly detectable in the late stages of a developing hazard when it is too late to avert the chain reactions that lead to irreversible thermal runaway and cell combustion. The complexity and required speed for LIB safety monitoring increases significantly when a large number of cells are present, such as multiple cells connected in series or parallel (or a combination thereof). For example, a chip connected to 12 cells and daisy-chained (connected in series) to 31 chips, results in a total number of 12×31=372 cells that (preferably) must be monitored individually.

U.S. Pat. No. 4,725,784 to Peled et al, entitled: "Method and apparatus for determining the state-of-charge of batteries particularly lithium batteries", discloses a method for determining the charge state of batteries having a constant discharge curve, such as lithium batteries. The battery temperature is measured, and then the battery is put on load to produce a high discharge for a short time period. After a short recovery time, the recovered open-circuit voltage and corresponding battery recovery time is measured. The residual state-of-charge of the battery is determined from the measured temperature and recovered open-circuit voltage, such as using reference tables.

U.S. Pat. No. 7,202,632 to Namba, entitled: "Battery management apparatus", discloses monitoring changes in battery impedance for battery management purposes, such as determining remaining capacity and degree of deterioration. The impedance is calculated using the terminal voltage, the open circuit voltage, and the current of the battery, when the variation in current and temperature are within predetermined ranges. The calculated impedance is compared with an initial impedance previously obtained from the initial state of the battery, to determine an impedance correction value depending on the degree of deterioration of the battery.

U.S. Pat. No. 7,433,794 to Berdichevsky et al., entitled: "Mitigation of propagation of thermal runaway in a multi-cell battery pack", discloses a method for mitigating thermal runaway in an electric vehicle multi-cell battery pack. Heat sources within the battery pack and plurality of cells are first identified. The temperature of the battery pack and cells is controlled while detecting predetermined conditions, such as by monitoring humidity, smoke, organic vapors, temperatures, voltage or current. Upon detection of a condition, a predetermined action is performed to ensure an overheating cell does not propagate to adjacent cells.

U.S. Pat. No. 8,269,502 to Desprez et al., entitled: "Method for determining the state of health of a battery using determination of impedance and/or battery state", discloses continuously evaluating the state of health (SOH) of a rechargeable battery, for controlling the battery charging or usage. An impedance of at least one battery cell is determined in real-time. At least one confidence coefficient is then determined as a function of at least one variable of the battery cell (current; temperature; state of charge; and/or derivatives or integrals thereof). The SOH of the battery at a given point in time is determined using the SOH at a preceding point in time corrected as a function of the impedance at the given point in time and weighted by the confidence coefficient(s).

PCT International Publication No. WO2010/016647 to LG Chem Ltd., entitled "Apparatus and method for estimating state of health of battery based on battery voltage variation pattern", discloses a method for estimating the state of health (SOH) based on the state of charge (SOC) of a battery. Battery voltage, current and temperature data are obtained from sensors, at each SOH estimation. A first SOC is estimated by current integration using the battery current data. An open-circuit voltage is estimated from the battery voltage variation pattern. A second SOC corresponding to the estimated open-circuit voltage and battery temperature is estimated, using correlations between the open-circuit voltage/temperature and the SOC. A convergence value for a weighted mean value of a ratio of the second SOC variation to the first SOC variation is calculated. A battery capacity corresponding to the weighted mean convergence value is estimated, using a correlation between the weighted mean convergence value and the capacity. The relative ratio of the estimated battery capacity and an initial battery capacity is stored as the battery SOH.

U.S. Patent Application Publication No. 2012/0182021 to McCoy et al, entitled: "Differential current monitoring for parallel-connected batteries", discloses a battery monitoring system that measures the difference in currents between two batteries connected in parallel. The differential current may be measured using a switch and current measurement device located between the two batteries. The measured differential current is used to detect a fault in one of the batteries.

U.S. Patent Application Publication No. 2013/0141109 to Love et al., entitled: "Battery health monitoring system and method", discloses a method for monitoring the state-of-health of rechargeable batteries and identifying defective batteries to be taken out of service. A precision frequency for the battery is determined, by applying an AC current or voltage perturbation across a frequency sweep with impedance spectroscopy equipment to obtain an impedance response, collecting data relating to the impedance response at various states of charge within a recommended battery voltage window, plotting the collected data on impedance curves, and analyzing the impedance curves at the various states of charge. An AC current or voltage perturbation is applied at the precision frequency, resulting in an impedance response. The value of the impedance response is recorded, and a battery classification zone that the impedance value falls within is determined.

PCT International Publication No. WO2004/106946 to World Energy Labs (2) Inc., entitled "A method and apparatus for measuring and analyzing electrical or electrochemical systems", is directed to a method and apparatus for measuring and analyzing the time-varying response of produced in an electrical/electrochemical element or cell when excited by a time-varying electrical signal. The response signal, and optionally the excitation signal, are sampled in a synchronous manner, and the sampled values are analyzed to determine various characteristics, including State of Charge and State of Health. The method may be used to evaluate the time domain response of systems, which exhibit the property of electrical impedance (or admittance). The method may operate in an open-loop form where the results of the measurement and analysis are provided, or in a closed-loop form where the results are used to provide feedback to modulate the behavior of a system or device.

SUMMARY OF THE INVENTION

In accordance with one aspect of the present invention, there is thus provided a method for monitoring the safety of a rechargeable Li-ion battery (LIB). The method includes the procedures of determining an initial electrical state of the LIB, altering the electrical state of the LIB by the application or removal of a direct current (DC) electrical stimulus to said LIB so as to trigger a time-varying response, and measuring the time-varying response of the LIB to the altered electrical state. The method further includes the procedures of extracting at least one primary response parameter associated with at least the functional form of the measured response, and deriving at least one secondary response parameter from the primary response parameter. The method further includes the procedure of determining a likelihood of a short circuit precursor condition (SCPC), in accordance with the primary response parameter and/or the secondary response parameter. The method may further include the procedure of deriving at least one composite response parameter from the primary response parameter(s) and/or secondary response parameter(s), such that the SCPC likelihood is further determined in accordance with the composite response parameter(s). The method may further include the procedure of providing an alert of a potential short circuit derived hazard (SCDH), in accordance with the determined SCPC likelihood. The method may further include the procedure of implementing at least one corrective measure to mitigate or prevent an SCDH, in accordance with the determined SCPC likelihood. The corrective measure may include applying a specific discharge voltage to the LIB, such that the applied discharge voltage oxidizes at least a portion of lithium plating in the LIB. The procedure of altering the electrical state of the LIB may include at least one of the following electrical stimuli: a discharging voltage; a charging voltage; a potentiostatic voltage; a linearly varying voltage; a discharging current; a charging current; a galvanostatic current; a linearly varying current; a discharging resistive load; a discharging constant power; and/or a charging constant power. The procedure of altering the electrical state of the LIB may include at least one of the following operations: switching the LIB to an open-circuit state or rest state from a discharging state or a charging state; switching the LIB to a charging state from an open-circuit state or a discharging state or a rest state; and/or switching the LIB to a discharging state from an open-circuit state or a charging state or a rest state. The procedure of altering the electrical state of the LIB may include the application of a step current to trigger a voltage response characterized by at least one response portion that includes: i) an instantaneous voltage change; ii) a double-layer charging phase; and iii) a Faradaic reaction phase. The procedure of altering the electrical state of the LIB may include the application of a linear voltage scan to trigger a current response characterized by at least one response portion that includes: i) a linear dependence region of current on voltage at low polarization; and ii) a logarithmic dependence region of current on voltage at high polarization. The primary response parameter may include at least one of the following: voltage response values at different times; current response values at different time; and parameters relating to the electrical state altering. The secondary response parameter may include at least one of the following: instantaneous voltage drop (iR drop); resistance of the iR drop; double layer capacity (C); time constant for the double layer charging or discharging phase (transition time $\tau_r$); Sand equation parameters; change in voltage during double layer charging or discharging; change in voltage during the Faradaic reaction phase of the applied current step; reaction resistance (Rrxn); exchange current density ($i_o$); Tafel slope ($\beta a$ or $\beta c$); reaction polarization (Rpol); current deviation value ($i_d$); current response as a function of applied voltage; derivatives and second order derivatives of a voltage-current functional form of a voltage scan; derivatives of current value; Randles-Sevcik equation parameters; voltage response as a function of applied current; instantaneous current change; resistance value of the instantaneous current change; Cottrell equation parameters; and/or changes in active area of LIB electrodes. The method may further include the procedure of measuring a temperature associated with the LIB, where the procedure of altering the electrical state of the LIB and the procedure of measuring the time-varying response of the LIB, takes into account the measured temperature. The method may further include the procedure of modifying the determination of the SCPC likelihood in accordance with user feedback or historical data. The method may further include the procedure of determining if the measured response deviated beyond predetermined limits. The SCPC likelihood may be determined in accordance with the rate of change of the primary parameter(s), secondary parameter(s) and/or composite parameter(s). The SCPC likelihood may be determined in accordance with the consistency between parameters of the primary parameter(s), secondary parameter(s) and/or composite parameter(s). The method may include the preliminary procedure of determining at least one authenticating feature of the LIB, such that implementing the method procedures is conditional on the authenticating feature. The SCDH may include: i) a combustion event of the LIB; ii) a self-discharge of the LIB; or iii) a dormant benign short-circuit state of the LIB.

In accordance with another aspect of the present invention, there is thus provided a system for monitoring the safety of a rechargeable Li-ion battery (LIB). The system includes a stimulus application device, configured to alter the electrical state of the LIB by the application or removal of a direct current (DC) electrical stimulus to the LIB so as to trigger a time-varying response. The system further includes a response measurement device configured to measure the time-varying response of the LIB to the altered electrical state. The system further includes a processor configured to extract at least one primary response parameter associated with at least the functional form of the measured response, and further configured to derive at least one secondary response parameter from the primary response parameter. The processor is further configured to determine a likelihood of a short circuit precursor condition (SCPC), in accordance with the primary response parameter and/or the secondary response parameter. The processor may be further configured to derive at least one composite response parameter from the primary response parameter(s) and/or secondary response parameter(s), such that the SCPC likelihood is further determined in accordance with the composite response parameter(s). The SCPC likelihood may be determined in accordance with the rate of change of the primary parameter(s), secondary parameter(s) and/or composite parameter(s). The system may further include a notification unit configured to provide an alert of a potential short circuit derived hazard (SCDH), in accordance with the determined SCPC likelihood. The system may further include a safety protocol unit configured to implement at least one corrective measure to mitigate or prevent an SCDH, in accordance with the determined SCPC likelihood. The corrective measure may include applying a specific discharge voltage to the LIB, such that the applied discharge voltage oxidizes at least a portion of lithium plating in the LIB. The stimulus application device may be configured to apply a step current to trigger a voltage response characterized by at least one response portion that includes: i) an instantaneous voltage change; ii) a double-layer charging phase; and iii) a Faradaic reaction phase. The stimulus application device may be configured to apply a linear voltage scan to trigger a current response characterized by at least one response portion that includes: i) a linear dependence region of current on voltage at low polarization; and ii) a logarithmic dependence region of current on voltage at high polarization. The system may further include at least one temperature sensor, configured to measure a temperature associated with the LIB, where altering the electrical state of the LIB and measuring the time-varying response of the LIB takes into account the measured temperature. The SCPC likelihood determination may be modified based on user feedback or historical performance data. The SCDH may include: i) a combustion event of the LIB; ii) a self-discharge of the LIB; or iii) a dormant benign short-circuit state of the LIB.

BRIEF DESCRIPTION OF THE DRAWINGS

The present invention will be understood and appreciated more fully from the following detailed description taken in conjunction with the drawings in which:

FIG. 6A is an illustration of a timing graph depicting an exemplary potentiostatic-step voltage stimulus, operative in accordance with an embodiment of the present invention;

FIG. 6B is an illustration of a timing graph depicting an exemplary current response of a LIB to the applied-step voltage stimulus of FIG. 6A, operative in accordance with an embodiment of the present invention;

DETAILED DESCRIPTION OF THE EMBODIMENTS

Figure 1:
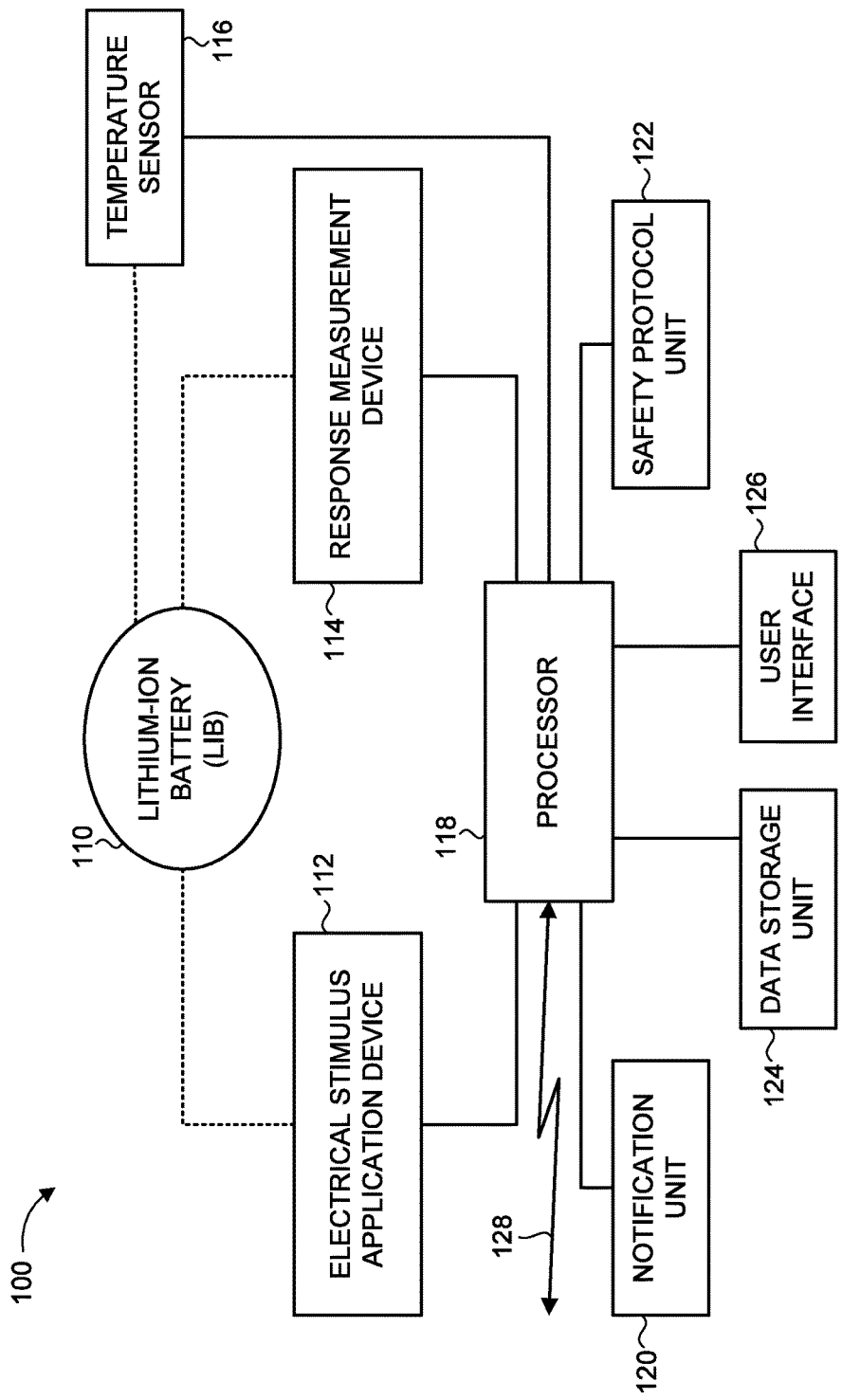
FIG. 1 is a schematic illustration of a system for monitoring the safety of a Li-ion battery (LIB), constructed and operative in accordance with an embodiment of the present invention.

The present invention overcomes the disadvantages of the prior art by providing an improved diagnostic method and system for monitoring the safety of a lithium-ion battery (LIB). The diagnostic method determines the likelihood of a forthcoming short circuit in the LIB cell at an early stage of its development, and thus identifies in real-time a consequent possible incidence of LIB combustion, allowing for the implementation of at least one preventative measure to ensure user safety. More particularly, the method uniquely detects and processes particular markers that represent early stage predictors or indicators of internal cell faults, which may develop into thermal runaway and inevitable combustion. These markers are in the form of first-order, second-order, and composite response parameters of a time-varying response of the LIB to an altered electrical state. For example, a time-varying response may include: the voltage, current, resistance, power and/or temperature of the LIB varying in response to: a (variable or constant) voltage, current, resistance, or power applied to the LIB.

An internal LIB short circuit initially starts with a high resistance, which subsequently decreases in value with extended cycling or prolonged durations. An initial "soft short" may slowly transition from a benign state, characterized by a relatively long induction time and high resistance, into a "hard short" with a much lower resistance (as cell ages). Once a critical low resistance is reached, the generated heat begins decomposing the organic electrolyte into flammable vapors and breaks down the cathode to release oxygen. The heat and combustible products formed by thermal degradation react rapidly to raise the temperature to several hundred degrees, causing further chain reactions. Irreversible thermal runaway may subsequently lead to fire or explosions in the LIB cells. The disclosed method may thus identify a barely noticeable initial soft short of an LIB early in its development, by identifying the first symptoms that could lead to such a short, and detects it significantly prior to the beginning of thermal runaway. The disclosed method is deployable on substantially any type of LIB present in various applications, and is operable under a range of environmental and operating conditions.

The term "battery" in general, and "lithium-ion battery (LIB)" in particular, and any variations thereof, as used herein refers to any such battery containing any number of electrochemical cells (or groups of cells) connected in any configuration (e.g., series, parallel, and combinations of series and parallel), including also a single-celled battery, as well as encompassing all types of cell geometries (e.g., including but not limited to: cylindrical, prismatic, pouch, coin, and button cells), sizes, and cell designs, (e.g., including but not limited to: jelly-roll design cells, wound cells, bobbin cells, cells with Z-fold electrodes, cells with dog-bone folded electrodes, cells with elliptically folded electrodes, and parallel plate electrode cells, whether bi-polar or not). A LIB generally includes at least a pair of electrodes (anode, cathode), an electrolyte for conducting lithium ions (liquid, solid, semi-solid and/or polymer), and a separator. The battery may be integrated with or form part of at least one electrical or electronic device or component (e.g., including but not limited to at least one of: a capacitor; a supercapacitor; a printed circuit board (PCB); a battery management system; an electronic control unit; a power adapter; a charger; a wireless charging system; a fuse; a sensor; a positive temperature coefficient (PTC) device; a current interrupt device (CID); and any combination thereof).

It is noted that "lithium ion (Li-ion)" herein also encompasses Li-metal rechargeable batteries, Li-ion rechargeable batteries, and Li-ion polymer rechargeable batteries, as well as these types of batteries as including but not limited to:

reserve type batteries, thermal type batteries, so-called lithium-ion capacitors, and Li-air and Li-sulfur batteries.

As will be elaborated upon further hereinbelow, the term "short-circuit precursor condition (SCPC)" is defined herein as any condition that may lead to a (non-benign) internal short-circuit within at least one LIB cell, which in turn may lead to a number of possible undesirable outcomes. Accordingly, the term "short circuit derived hazard (SCDH)" refers herein as any one of the possible outcomes of a LIB (hard) short-circuit, which include: i) exothermic chain reactions followed by thermal runaway and subsequent combustion (i.e. "a combustion event"); ii) unwanted self-discharge of the LIB cell; or iii) the LIB cell remaining in a dormant benign SCPC state for an unknown period of time, with an unknown probability of eventually developing into a combustion event. The term "combustion event" is used herein broadly to encompass all forms of potentially unsafe battery states following or caused by thermal runaway, including but not limited to a LIB (and/or associated electronic component) undergoing, at least partially: a fire, explosion, enflaming, rupturing, leaking of electrolyte solution, swelling, venting, and the like.

The terms "charging state" and "discharging state", and respective grammatical variations, as used herein, may refer to how much a LIB cell is charged/discharged (e.g., "50% state of charge" or "25% depth of discharge"), whereas the terms "charging" and "discharging" may refer to the cell being actively charged/discharged.

Reference is now made to FIG. 1, which is a schematic illustration of a system, generally referenced 100, for monitoring the safety of a Li-ion battery (LIB), referenced 110, constructed and operative in accordance with an embodiment of the present invention. System 100 includes an electrical stimulus application device 112, a response measurement device 114, a temperature sensor 116, a processor 118, a notification unit 120, a safety protocol unit 122, a data storage unit 124, a user interface 126, and a data communication link 128. Processor 118 is coupled with electrical stimulus application device 112, with response measurement device 114, with temperature sensor 116, with notification unit 120, with safety protocol unit 122, with data storage unit 124, with user interface 126, and with data communication link 128.

Electrical stimulus application device 112 is configured to apply a form of electrical stimulus to LIB 110, such as for example an applied voltage or applied current, and/or to alter the electrical state of LIB 110 in some manner, such as transferring LIB 110 to or from a rest or open circuit condition. Stimulus application device 112 may be controlled automatically or manually in order to establish or adjust different parameters of the applied stimulus, such as: frequency of repetition, type, magnitude, and duration. The adjustment of an applied stimulus may be done in real-time and/or pre-configured. The stimulus may be applied for at least a scheduled time period, or in response to operational changes of the LIB, and/or may be triggered by some event internal or external to LIB 110. Examples of stimulus application device 112 include but are not limited to: a voltage generator, a current generator, electronic circuitry, a device configured to open a circuit and/or place a LIB in a rest state, a device for applying a load (such as a resistive load), an electrical power supply, an electrical converter (AC and/or DC), an electrical inverter (AC and/or DC), a LIB charger, a LIB power adapter, a LIB wireless charger, and the like (including instruments that incorporate, in whole or in part, at least one such device).

Response measurement device 114 is configured to measure the electrical state and characteristics of LIB 110, including measuring a response of LIB 100 to an applied electrical stimulus (and/or applied alteration in electrical state). Examples of response measurement device 114 include but are not limited to: a voltage monitoring device, a current monitoring device, electronic circuitry, response analyzer, a voltmeter, a current meter, a resistance meter, an impedance measuring device, a frequency response analyzer, an LCD meter, and the like (including instruments that incorporate, in whole or in part, at least one such device).

Temperature sensor 116 detects the temperature of LIB 110 and/or the ambient temperature in the vicinity of LIB 110. Temperature sensor 116 may be embodied by a plurality of sensors (e.g., a first sensor for detecting the battery temperature, and a second sensor for detecting the environmental temperature). The temperature of LIB 110 may be dependent on numerous factors (e.g., battery size; battery age; operational duration; rate of charge or discharge; type of application in which the battery is embedded), and may influence the response of LIB 110 to an applied electrical stimulus, as will be discussed further hereinbelow. Temperature sensor 116 may be embodied, for example, by a thermocouple, a semiconductor or silicon diode, an optical pyrometer, an infrared measurement device, or any other type of sensor operative to detect thermal information.

Notification unit 120 provides an indication of a safety condition of LIB 110. In particular, notification unit 120 is configured to provide an alert or warning in the event that a short-circuit precursor condition has been detected. Notification unit 120 may also provide additional types of indications relating to, for example, the state of health (SOH) and/or state of charge (SOC) of LIB 110. Notification unit 120 may utilize various warning measures, such as visual indications (e.g., displaying text, markings and/or symbols, changing colors of graphical info, etc.) and/or audio indications (e.g., alarms, beeps, buzzers, bells, ringtones). Notification unit 120 may also be configured to provide such an alert or warning to a remote location, such as by transmitting the indication (e.g., via data communication link 128) to at least one of: a remote server or application in a cloud computing network; a service center, a monitoring station, and the like. Accordingly, notification unit 120 may include one or more devices or instruments configured for audio communication (e.g., an audio speaker, a speech generating unit) and/or visual communication (e.g., a display screen; a graphical user interface; flashing lights). Notification unit 120 may optionally be integrated with user interface 126, or may be a separate unit. A plurality of notification units 120 may provide warnings, e.g., concurrently, at different locations (e.g., at the location of LIB 110, at a service center, and/or at a remote monitoring station).

Safety protocol unit 122 is configured to implement or trigger at least one process or action to counteract or neutralize a potentially hazardous condition of LIB 110, such as by altering the electrical state thereof. For example, when a SCPC of LIB 110 is identified, safety protocol unit 122 may provide electrical isolation of a problematic LIB cell from other cells of LIB 110, or may automatically cutoff the power supply to LIB 110. In other examples, safety protocol unit 122 may be configured to replace the suspect LIB, to initiate cell balancing via an auxiliary system in a multi-cell battery, or to apply a discharge voltage to remove plated lithium. In yet a further example, safety protocol unit 122 may immediately cool at least a portion of LIB 110, such as by applying a fluid-based or air-based cooling mechanism, and/or venting hot gases away from LIB 110. Safety protocol unit 122 may be automated, such as being preconfigured to perform selected corrective measures to certain batteries when they experience particular safety conditions. Safety protocol unit 122 may also be controlled and operated manually, such as by selecting an optimal safety measure and defining the settings of the selected safety measure in real-time in accordance with the actual battery scenario.

User interface 126 allows a user of system 100 to control various parameters or settings associated with the components of system 100. For example, user interface 126 can allow a user to adjust parameters or settings of notification unit 120 (e.g., selecting the type of alert(s) to be provided, and at what detection limits or conditions to provide the alert(s)) and/or parameters or settings of safety protocol unit 122 (e.g., selecting the type of safety protocol to be implemented, and under which conditions). User interface 126 may also be configured to select the operational settings of stimulus application device 112 and/or response measurement device 114. User interface 126 may include a cursor or touch-screen menu interface, and/or voice recognition capabilities for allowing a user to enter instructions or data by means of speech commands User interface 126 may also be configured to receive input data remotely (e.g., via data communication link 128), such as from: a service center, a monitoring station, and/or a remote server, application or database in a cloud computing network, where the input may be provided by a predetermined command or in real-time.

Data storage unit 124 provides storage of data relevant to the operation of system 100. For example, data storage unit 124 may include predefined data relating to different types or configurations of LIBs, such as: battery sizes, operational limits, voltage/current limits, charge/discharge rates, temperature coefficients and/or factors for various electrical stimuli and responses (e.g., to allow for suitable adjustments, if necessary, of the stimulus applied to the LIB). Data storage unit 124 may also store real-time data relating to the monitored LIB 100, such as: applied stimulus and response data (including variations of each over time), cell operating parameters (e.g., voltage, current, temperature) prior to and after application of stimulus, environmental temperature surrounding the LIB, cycle number, state of charge, state of health, depth of discharge, the state of the LIB when the stimulus is applied (e.g., whether the LIB is in a charge, discharge, rest or open circuit state), expected response values for the measured response, data concerning the physical and chemical properties of the LIB, as well as information for LIB behavior during operation (e.g., nominal capacity and voltage during charge and discharge as a function of environmental temperatures, and rates of corresponding charge and discharge), and the like. Data storage unit 124 may also store information relating to previous monitored LIBs (including LIB 110), such as a historical overview of monitoring sessions and crowdsourced data including the electrical states and measured responses over time (and safety outcomes) of the monitored LIBs. Data storage unit 124 may include information that is restricted to certain users only, such as a supervisor account with enhanced access privileges.

Data communication link 128 allows for sending and receiving information between internal system components or to/from an external location. Data communication link 128 may include means for wired or wireless communication (e.g., cellular, Bluetooth, Wi-fi communication, and the like), in any suitable form (e.g., electronic, optical, electromagnetic, and/or radio frequency based signals). Data communication link 128 may also be embedded or coupled with an existing system communications platform, such as by accessing a wireless or cellular network in the vicinity of LIB 110.

Processor 118 receives instructions and data from the components of system 100. Processor 118 performs processing and analysis of numerous parameters associated with LIB 110 (including first-order parameters, second-order parameters and composite parameters) to detect when a short circuit precursor condition has occurred, as will be elaborated upon further hereinbelow. Processor 118 may also provide instructions to notification unit 120 and/or safety protocol unit 122, such as to generate a warning or implement a corrective measure, respectively, in accordance with a detected safety hazard or state of safety (SoS) of LIB 110. Processor 118 may be situated at a remote location from the other components of system 100. For example, processor 118 may be part of a server, such as a remote computer or remote computing system or machine (including a cloud-based computing system), which is accessible over a communications medium or network. Alternatively, processor 118 may be situated in the vicinity of LIB 110 and/or integrated within other components of system 100. For example, processor 118 may be coupled to components of system 100 via a wireless connection, a wired connection, or a communication BUS. Alternatively, processor 118 may be incorporated with a computer associated with response measurement device 114. Processor 118 may also be configured to optimize the functioning of system 100 via, for example, machine learning techniques.

The components of system 100 may be based in hardware, software, or combinations thereof. It is appreciated that the functionality associated with each individual component of system 100 may be distributed among multiple components, which may reside at a single location or at multiple locations. For example, the functionality associated with processor 118 may be distributed between multiple processing units (such as a dedicated image processor for the response analysis). System 100 may optionally include and/or be associated with additional components not shown in FIG. 1, for enabling the implementation of the disclosed subject matter. For example, system 100 may include a power supply (not shown) for providing power to the various components, and may further include an additional memory or storage unit (not shown) for temporary storage of cell operating parameters or other types of data. System 100 may additionally include an on/off switch, and lights or other visual markers (e.g., to indicate that an ongoing function is happening or has been completed; to indicate the state of the system, and the like). It is noted that some of the components of system 100 are optional, and may not be utilized in at least some embodiments of the present invention.

System 100 may additionally include an authentication function or unit (not shown), for activating stimulus application device 112 and/or other components of system 100. In one embodiment of the present invention, such authentication may take the form of a component of system 100 prompting the LIB 110 for distinguishing authenticating features. For example, system 100 may examine data stored in an electronic circuit embedded in LIB 110 (e.g., in the form of a software program), or record a response to a "pre-check stimulus" that has a characteristic functional form, in order to verify that LIB 110 is a permitted LIB for applying the disclosed method. In another embodiment, LIB 110 may be provided with an electronic circuit with embedded data (e.g., in the form of a software program) that is downloaded to system 100, and which is required to trigger the activation of the disclosed method.

The operation of system 100 will now be discussed in general terms, following which will be provided specific examples of particular implementations. System 100 may be configured to operate continuously during the functioning of LIB 110, and/or be activated by an external device or a predetermined event. For example, system 100 may be activated by a connection or disconnection of a charger and/or by the activation of a device in which LIB 110 is integrated (such as a battery management system, an electronic control unit, a power adapter, and the like). System 100 first measures an initial electric state of LIB 110. System 100 subsequently alters the electric state of LIB 110 in accordance with the initial electric state, such as by applying (or removing) a DC electrical stimulus to LIB 110 (via stimulus application device 112) or transitioning LIB 110 into an open-circuit state or a rest state. System 100 may also periodically and/or continuously monitor the electrical state of LIB 110, in anticipation of future applied stimuli or electrical state alterations.

The initial state of the 110 LIB from which the various stimuli/alterations are applied may be: a charge mode (constant current, constant voltage, constant power, or combinations or variations thereof); a discharge mode (constant current, constant voltage, constant power, resistive load, or combinations or variations thereof); an open circuit (physical disconnection from electronic circuitry); or a rest mode (no current, voltage, power, or resistance applied to the LIB but the LIB is still connected to the system electronics with possible leakage currents or electrical drain from the electronic components). In general, the applied stimulus to the initial state may include at least one of the following: application of a voltage (discharging or charging); application of a current (discharging or charging); application of a resistive load (discharging); application of a constant power (discharging or charging, voltage and current are regulated, and either one may be adjusted so as to maintain a constant power); application of an open circuit; application of a rest; and combinations of transitions between any of the above, from any state of charge or depth of discharge, and in any sequence.

Altering the electric state of LIB 110 may further include at least one of the following: switching LIB 110 into an open-circuit state from a discharging state or from a charging state; switching LIB 110 into a rest state from a discharging state or from a charging state; switching LIB 110 into a charging state from an open-circuit state, a rest state, a different charging state or from a discharging state; and switching LIB 110 into a discharging state from an open-circuit state, a rest state, a different discharging state or from a charging state. In general, the "discharging" and "charging" may be by any one of: current, voltage, power, or (in the case of discharge) resistive load. For example, charging or discharging of LIB 110 may be interrupted to transition LIB 110 into a temporary open-circuit condition. In a further example, during such temporary open-circuit condition a stimulus is applied, before LIB 110 is returned to its respective charging or discharging state. Alternatively, LIB 110 may be returned to a different condition than its initial state prior to the open-circuit state (i.e., transitioning LIB 110 into a discharged state if the pre-open-circuit condition was charging, or into a charged state if the pre-open-circuit condition was discharging, or into a different discharged state if the pre-open circuit condition was discharging, or into a different charged state if the pre-open circuit condition was charging, and combinations thereof). The value of an applied stimulus may be constant or varied over the course of its application, including increasing and/or decreasing the value, for example at a defined rate of change with respect to time.

The magnitude and duration of the stimulus applied to LIB 110 may be chosen so as to avoid causing any harm to LIB 110. As such, the magnitude of the applied stimulus (e.g., the voltage level or current level), or other parameters relating to the applied stimulus, may be varied or adjusted during the application of the stimulus (and during transitions between electrical state) accordingly. Typical voltage limits are that LIB cells should not exceed approximately 4.1-4.25 volts on charging, and should not drop below 2.5-2.75 volts on discharge. However, these limits depend on cell chemistry (for example some LIBs can operate above 4.2 volts, and some discharge below 2.5 volts). The present invention is applicable for all voltage ranges of LIBs.

The shape of the applied stimulus may include any signal pattern, such as at least one of the following waveforms: pulse; half-pulse; square or step scan or ramp; sinusoidal; rectangular; triangular; sawtooth; and staircase. The stimulus waveform may be analog or digital (e.g., small discrete steps). The stimulus pattern (or any segment thereof) may be linear or non-linear and may be symmetrical or non-symmetrical, including a single or multiple transitions, and may include constant or variable pulse widths, and constant or variable pulse magnitudes, applied over various time lengths and rates. The stimulus may be applied against a background current/voltage/power, whether the background is constant or not. The stimulus may include a repeating pattern, including a sequence of different stimulus segments applied repetitively or sequentially (with or without variations) over multiple cycles. It is further noted that the state of charge or state of discharge of a LIB during the course of an applied stimulus may range anywhere between 0% to 100%.

Figures 2A, 2B:
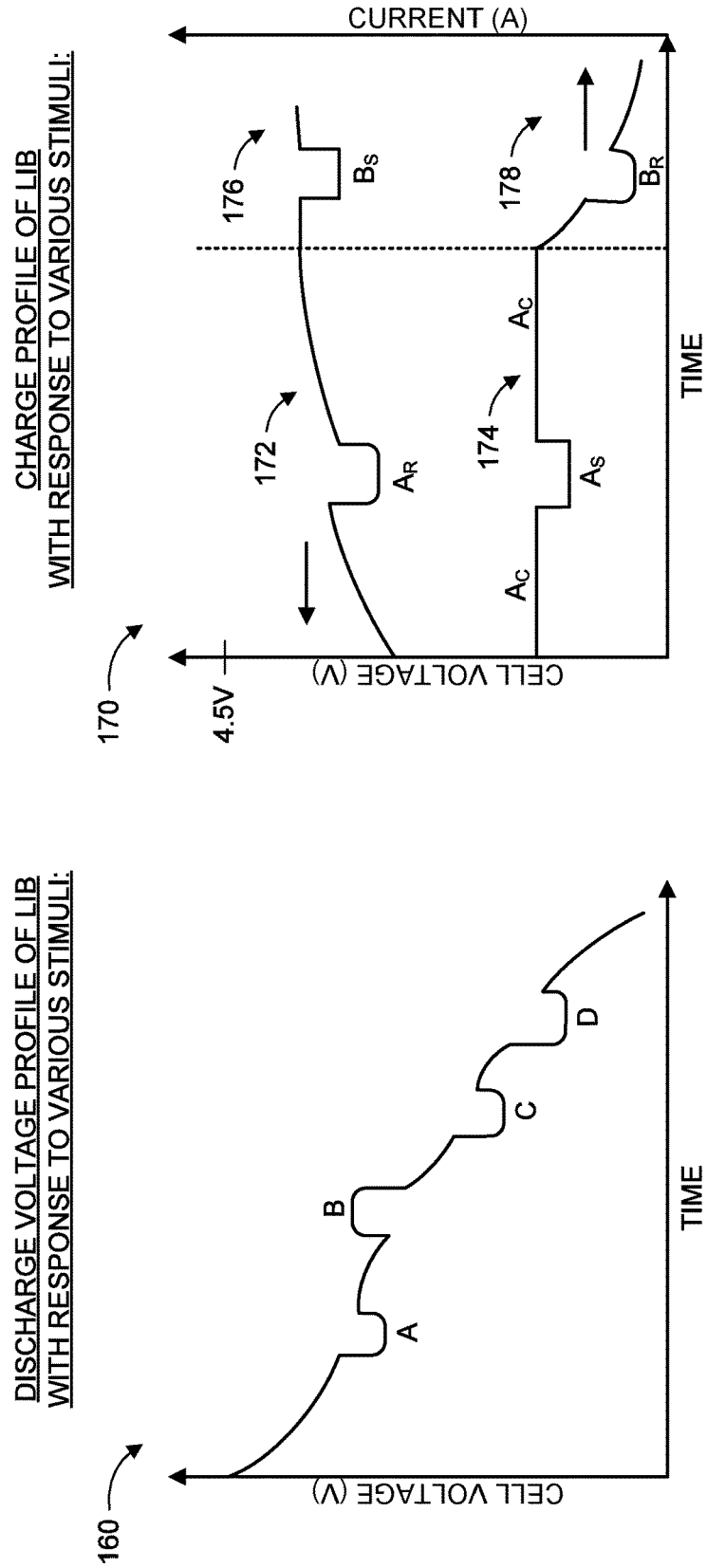
FIG. 2A is an illustration of a timing graph depicting an exemplary discharge voltage profile of a LIB responding to various stimuli, operative in accordance with an embodiment of the present invention.
FIG. 2B is an illustration of a timing graph depicting an exemplary charge profile of a LIB responding to various stimuli, operative in accordance with an embodiment of the present invention.

Reference is now made to FIG. 2A, which is a schematic illustration of a timing graph, referenced 160, depicting an exemplary discharge voltage profile of a LIB responding to various stimuli, operative in accordance with an embodiment of the present invention. In the example of graph 160, the background discharging voltage may represent the observed change in voltage to a resistive or current drain. Portion "A" illustrates the voltage response following the application of a (temporary) lower resistance or higher discharge current, and their respective release. Portion "B" illustrates the approximate voltage response following the application of a (temporary) higher resistance or lower discharge current, and their respective release. Portions "C" and "D" represent the voltage response to a sequence of applied "A" type stimuli (i.e., a sequence of lower resistances or higher discharge currents and their releases).

Reference is now made to FIG. 2B, which is an illustration of a timing graph, referenced 170, depicting an exemplary charge profile of a LIB responding to various stimuli, operative in accordance with an embodiment of the present invention. In the example of graph 170, the charging mode is constant current to the left of the dotted line, and the charging mode is constant voltage to the right of the dotted line. Left of the dotted line, the upper curve segment 172 shows a representation of a voltage response ($A_R$) to a current alteration step ($A_S$) (i.e., a square wave) of lower curve segment 174 applied during a constant current (Ac) charging mode, where the applied charging current (As) is less than the constant charging current (Ac). After the current step (As) is released, the charging current returns to the original (Ac) constant current charging level, with the resultant change in voltage. The lower curve segment 178 to the right of the dotted line represents the current response ($B_R$) to a constant voltage step ($B_S$) (i.e., a square wave) of upper curve segment 176 applied during charging mode, where the applied voltage of the step is less than the constant charging voltage. In alternative examples, the step current stimulus ($A_S$) may be greater than the background constant charging current, may be a discharging current, may be an open circuit condition, or may be a rest condition, while the step voltage stimulus ($B_S$) may be greater than the constant charging voltage, may be a discharging voltage, may be an open circuit condition, or may be a rest condition. In yet a further example, a sequence of different electrical stimuli may be applied, in different combinations. Each stimulus in the sequence may have different characteristics, such as varying pulse widths, varying step sizes or magnitudes, and the like. For instance, a constant charging current (or voltage) may be followed by a charging current greater than the charging value, followed by a charging current lower than the charging value. Such a sequence may then be repeated over additional cycles, or may be altered (e.g., such that a first stimuli group is followed by a different group of stimuli and/or the same stimulus group applied with a different order of its individual stimuli portions, and so forth).

According to one example, the pulse length of the applied stimulus is short relative to the cycle time, and the difference of the current/voltage magnitude relative to the nominal current/voltage is also relatively small. For example, the pulse width may be less than one second, such as less than 0.25 seconds or less than 0.1 seconds. Alternatively, the pulse width may last for several seconds (e.g., approximately 6, 12, or 30 seconds).

Figure 3:
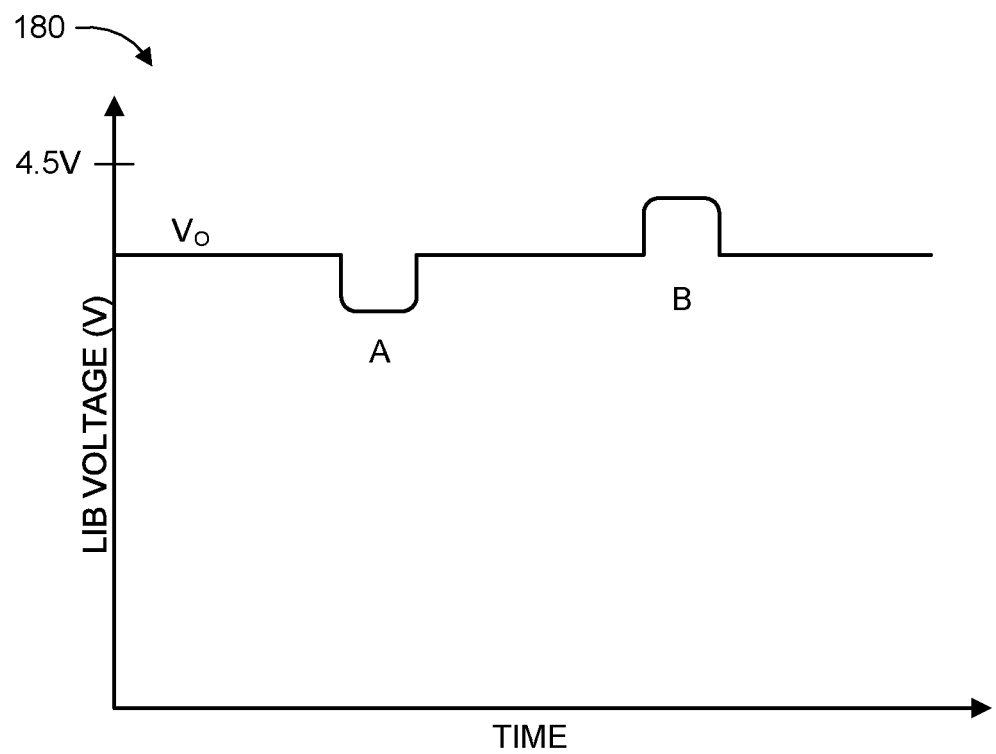
FIG. 3 is an illustration of a timing graph depicting an exemplary voltage profile of a LIB responding to various stimuli in an open-circuit state, operative in accordance with an embodiment of the present invention.

Reference is now made to FIG. 3, which is an illustration of a timing graph, referenced 180, depicting an exemplary voltage profile of a LIB responding to various stimuli in an open-circuit state, operative in accordance with an embodiment of the present invention. In the example of graph 180, the y-axis represents the cell voltage of the LIB, with the constant voltage value "$V_o$" being the open circuit voltage. Portion "A" is the response of the voltage due to a discharge stimulus (of either voltage, current, resistive load, or power), while portion "B" is the response due to a charge stimulus (of either voltage, current, or power). As well, a sequence of different electrical stimuli may be applied in different combinations, such as a first voltage step that is a charging stimulus followed by a second voltage step that is a discharging stimulus, and so forth.

Referring back to FIG. 1, after the electrical state of LIB 110 is altered, processor 118 analyzes the response of LIB 110 (as measured using response measurement device 114) and determines from the response the likelihood of a short circuit precursor condition. A "short circuit precursor condition (SCPC)" includes any condition that may lead to a (non-benign) internal short-circuit within LIB 110, which then leads to a "short circuit derive hazard (SCDH)". Short circuit derived hazards include: i) internal LIB reactions followed by thermal runaway and subsequent combustion; ii) self-discharge of the LIB cell, or iii) the LIB cell remaining in a dormant benign state for an unknown period of time, with an unknown probability of eventually developing into a combustion event. Examples of short circuit precursor conditions include but are not limited to: an internal cell physical defect (e.g., due to a torn separator or mechanical deformation which provides a pathway for the anode and cathode to physically contact); growth of lithium dendrites (e.g., due to charging, especially fast charging at low temperatures); growth of copper dendrites (e.g., due to over-discharge); the presence of a contaminant in the cell; a faulty component or state of a cell; a degraded state of a cell; abusive or excessive operating conditions of the cell; physical impacts or stresses that damage the cell internally, particularly in a benign, initially minor fashion (such as repeated cycling which causes volume changes of the electrodes and may result in delamination of an electrode from its current collector and subsequent contact, intermittent or otherwise, with the other electrode); and combinations thereof. The analysis of the response will be elaborated upon further hereinbelow.

If a short circuit precursor condition is detected, such that there is a sufficiently high likelihood that LIB 110 will progress to a short circuit derived hazard (i.e., thermal runaway, self-discharge, or a dormant benign state), then an alert may be provided (via notification unit 120) and/or at least one corrective measure may be implemented (via safety protocol unit 122). Corrective measures can include any type of action or process intended to mitigate or prevent the occurrence of a SCDH. Examples include: electrically or thermally isolating the LIB cell or cell group from the rest of the battery; imposing limits on the operating window of the suspect LIB cell or cell group (e.g., limiting voltage range or current range on charge or discharge, limiting the duration or rate of charge or discharge, making adjustments in cell operation for environmental thermal conditions, limiting the state of charge (SoC) to within a specific range; limiting the depth of discharge (DoD) to within a certain range, and the like); ceasing power supply to the battery; transferring the LIB to an open-circuit state or to a rest state; cooling the suspected LIB cell or cell group (e.g., by applying a cooling mechanism that may include a liquid or gas-based coolant, by activating a cooling fan, by venting hot gases away from the cells); activating a thermal barrier; activating extinguishing means or material; activating a ventilation or venting mechanism; activating a thermally interruptible electrical conductor; activating a frangible coupling between the LIB (or individual cells or cell groups) from the device it is operating; physically removing or disconnecting the suspected cell from the device, or if a multi-cell pack, then physically disconnecting or removing the suspected cell from the multi-cell pack; and/or further evaluation of the battery (e.g., taking the associated equipment in for servicing at a certified center). Further corrective measures may attempt to actually eliminate or neutralize the short circuit of LIB 110, allowing for recovery such that LIB 110 can continue operating without any precautionary limitations. For example, a specific discharge voltage may be applied to a LIB cell(s) identified as having a SCPC due to lithium plating, where the applied discharge voltage causes a reaction that strips (oxidizes) at least a portion of the lithium plated in the LIB cell(s). The appropriate specific discharge voltage may be determined from the functional form of at least one response to at least one stimulus applied to the LIB.

Figure 4:
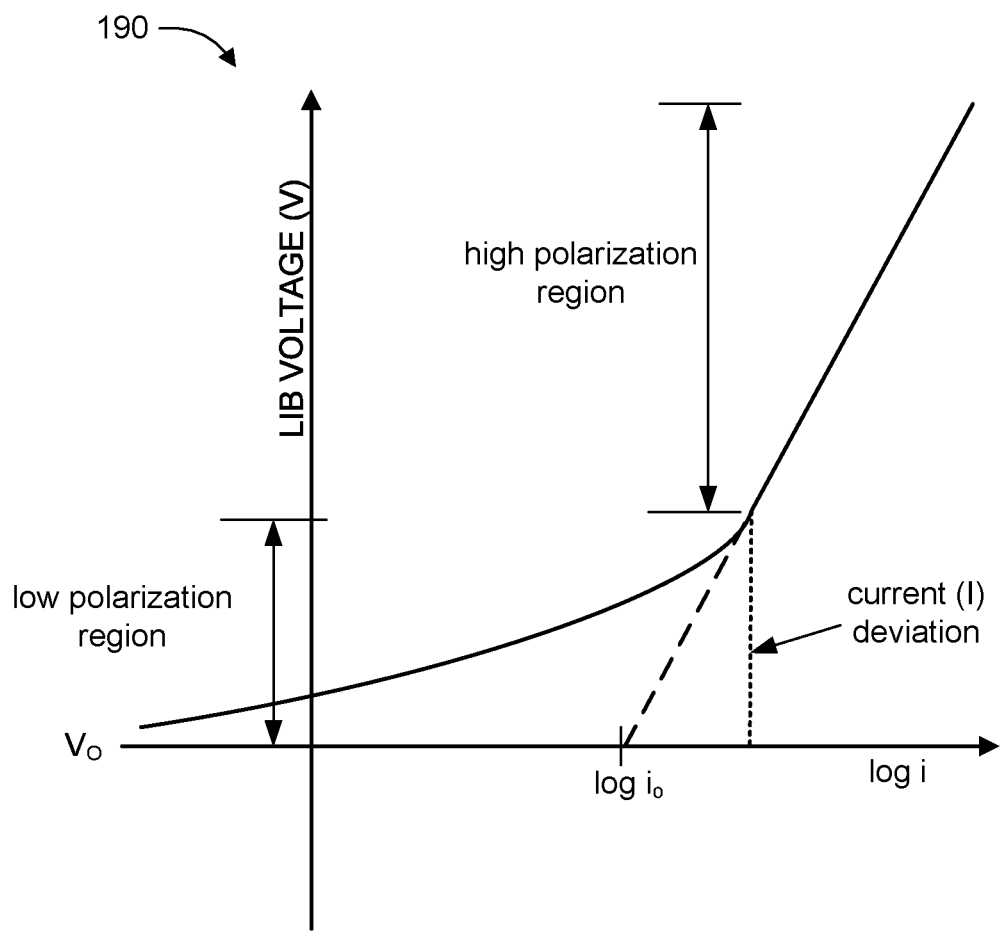
FIG. 4 is an illustration of a graph depicting an exemplary applied voltage scan as a function of the logarithmic current response of a LIB, operative in accordance with an embodiment of the present invention.

Reference is now made to FIG. 4, which is an illustration of a graph, referenced 190, depicting an exemplary applied voltage scan as a function of the logarithmic current response of a LIB, operative in accordance with an embodiment of the present invention. The y-axis of graph 190 represents the applied voltage during the scan, which is scanned at a fixed pre-determined rate (dV/dt, where "V" is the applied voltage and "t" is time). The x-axis of graph 190 represents the natural logarithm of the current response of the LIB. The scan is started close to the open circuit voltage ($V_o$) of the LIB. The voltage scan may be either in a charge or discharge direction from the starting voltage, or a combination thereof. For example, the scan may start anodic to the open circuit voltage, then scanning cathodically so that the scan voltage passes through the open circuit voltage and then enters the cathodic region. Alternatively, the scan may start cathodic to the open circuit voltage and then scan anodically so that the scan voltage passes through the open circuit voltage and then enters the anodic region. The voltage limits of the scan can be set so as to obtain a functional form of the applied voltage vs. measured current relationship. Graph 190 shows a low polarization region at low values of applied voltage where the voltage-current relationship is linear, and a high polarization region at greater applied voltages where the voltage-current relationship is characterized by a linear relationship of the (natural) logarithm of the measured current with the applied voltage. The scan rate can be set within reasonable limits. For example, the rate can be set in the range of between approximately 1 mV/sec to 10 mV/sec.

A number of useful parameters may be extracted from the measured current response in the example protocol of FIG. 4. Some general examples include: a measure of the cell resistance, which may change due to the formation and development of internal shorts; a measure representing the electrochemical reaction rates at the LIB electrodes surfaces; a measure representing the nature of the electrode (e.g., its composition, especially at the surface), which could be affected by changes in the chemistry of the electrode surface due to the formation and development of an internal short circuit, such as lithium or copper dendrites; physical qualities, such as the electrode surface area and roughness as an internal short develops (e.g., as lithium dendrites or copper dendrites form and grow in a LIB, the character of the interface of the electrodes will change accordingly); a measure representing the mechanism of the reaction(s) occurring at the electrodes surfaces, which is affected by the internal short circuit effects on the chemical composition and physical characteristics of the electrode surface, thereby impacting the reaction mechanism; a measure of the current value, according to a predetermined rule, where fitted data for the current-voltage relationship deviates from the actual data.

Particularly useful parameters that may be extracted in the protocol of FIG. 4 include: the reaction polarization; the exchange current density; and the Tafel slope. At low values of applied voltage (i.e., low polarization region), the current-voltage relationship is typically linear and the slope of the curve in this region can be calculated via Ohm's Law to provide a resistance parameter, referred to as the reaction polarization (Rpol). The resistance of the LIB is known to change in response to the formation and development of internal shorts, so Rpol can be used as an indicator for the progressive growth of the short. A polarization resistance measurement can be performed by scanning through a voltage range close to the open circuit voltage ($V_o$).

The exchange current density parameter, typically represented as "$i_o$", reflects the intrinsic rates of electron transfer at the LIB electrode interface with the cell electrolyte, and is indicative of the catalytic properties of the electrode materials. The exchange current depends critically on the nature of the electrode (e.g., its composition, especially at the surface), and physical qualities such as its surface area and roughness. As an internal short develops (e.g., as lithium dendrites or copper dendrites form and develop in a LIB), the character of the interface of the electrodes will change accordingly. For example, the surface of a graphite or other type of anode may be at least partially covered by a deposition of lithium metal that can grow into dendrites that short-circuit the cell. This initial lithium deposit will change the rate kinetics of the charge and discharge reactions at the anode, and also affect its surface area, thereby influencing the value of the exchange current density. A determination of the exchange current density can be used by various fitting protocols to the current-voltage relationship when it is under charge transfer control (associated with relatively high applied voltages in a region where the applied voltage is proportional to the log of the measured current), and extrapolating to zero current (open circuit voltage).

The Tafel slope (also referred to as the "Tafel constant" and sometimes represented as $\beta$) may be determined from the ratio of the change in applied voltage with the log value of the current response at relatively high applied voltages, in a region where this relationship is characterized by a linear relationship of the logarithm of the measured current with the applied voltage (i.e., the high polarization region of graph 190). In particular, the Tafel slope may be represented by the known Tafel equations: $E=\beta a \log i$ measured/log exchange current density for an anodic scan and $E=\beta c \log i$ measured/log exchange current density for a cathodic scan, where "$i_o$" is the exchange current density, "$\beta a$" is the Tafel slope for anodic (charging) scans, "$\beta c$" is the Tafel slope for cathodic (discharging) scans, and "E" is the difference between the potential measured when a current (i) is passed and the equilibrium or open circuit voltage of the LIB. The Tafel slope provides information on the number of electrons participating in the charge transfer reaction and the mechanism of the reaction. Thus, changes in the reaction at an electrode will be reflected in the value of the Tafel slope.

It is noted that processor 118 may further analyze the measured response of LIB 110 in comparison with an expected response. In particular, particular response characteristics may be expected in response to a particular applied stimulus, such as the associated response parameters having values within an expected range. Accordingly, if the actual response parameters are beyond the expected values, then the response may be flagged as incorrect or suspicious, (e.g., resulting in further verification, and/or repeating or changing the applied stimulus).

Figure 5A:
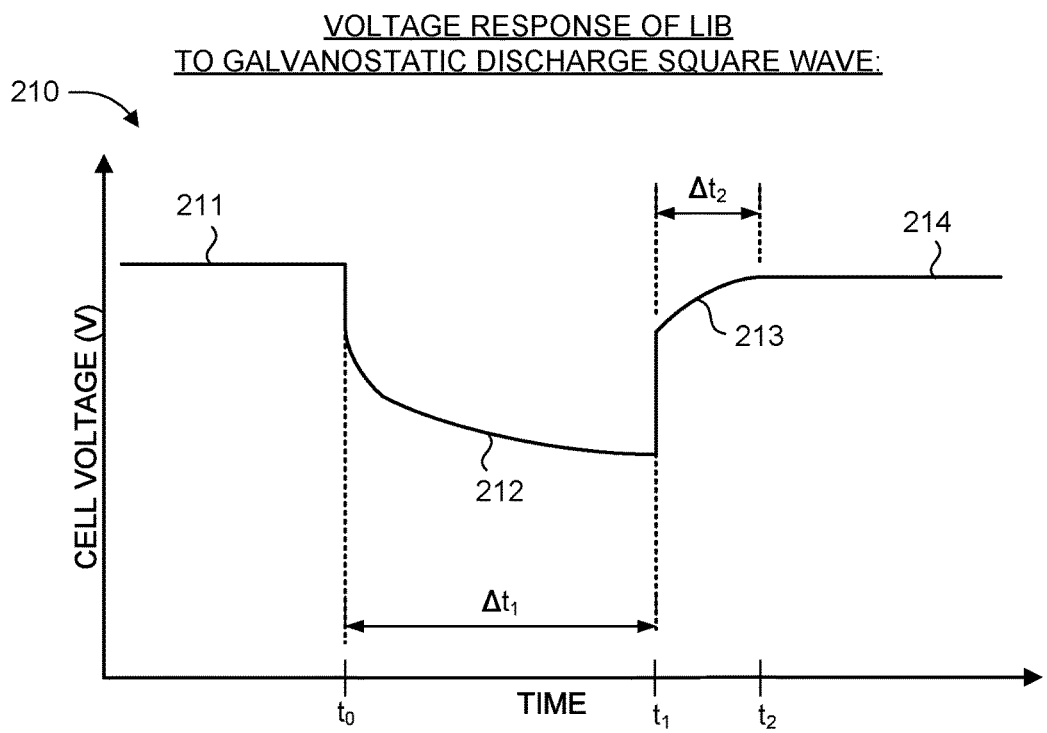
FIG. 5A is an illustration of a timing graph depicting an exemplary voltage response of a LIB to an applied square-wave discharge current, operative in accordance with an embodiment of the present invention.
Figure 5B:
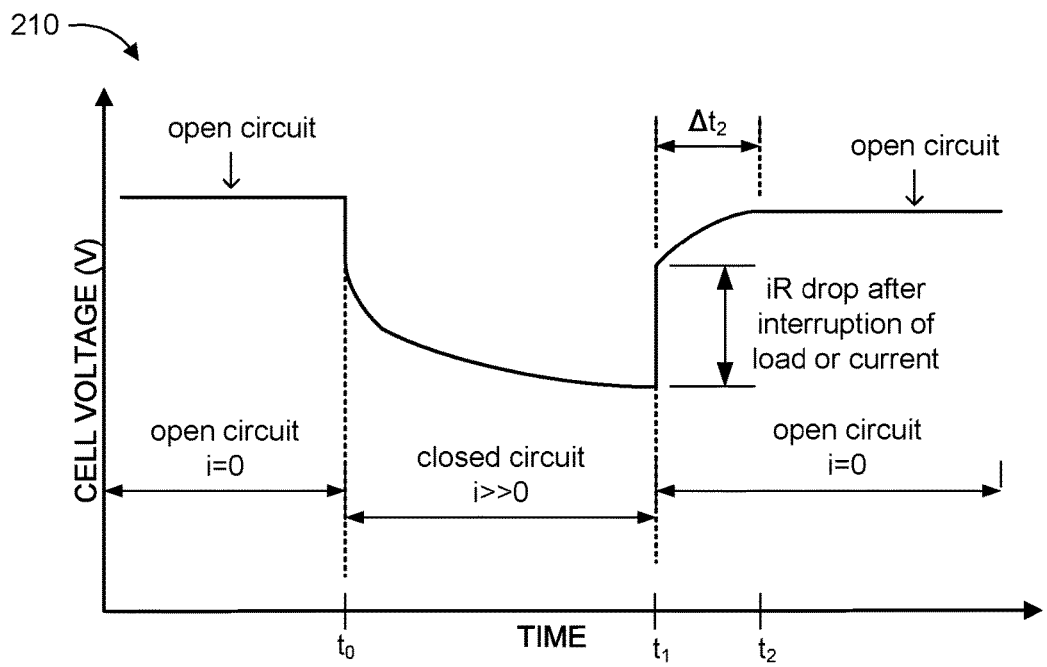
FIG. 5B is an illustration of the timing graph of FIG. 5A depicting different segments of the voltage response profile.
Figure 5C:
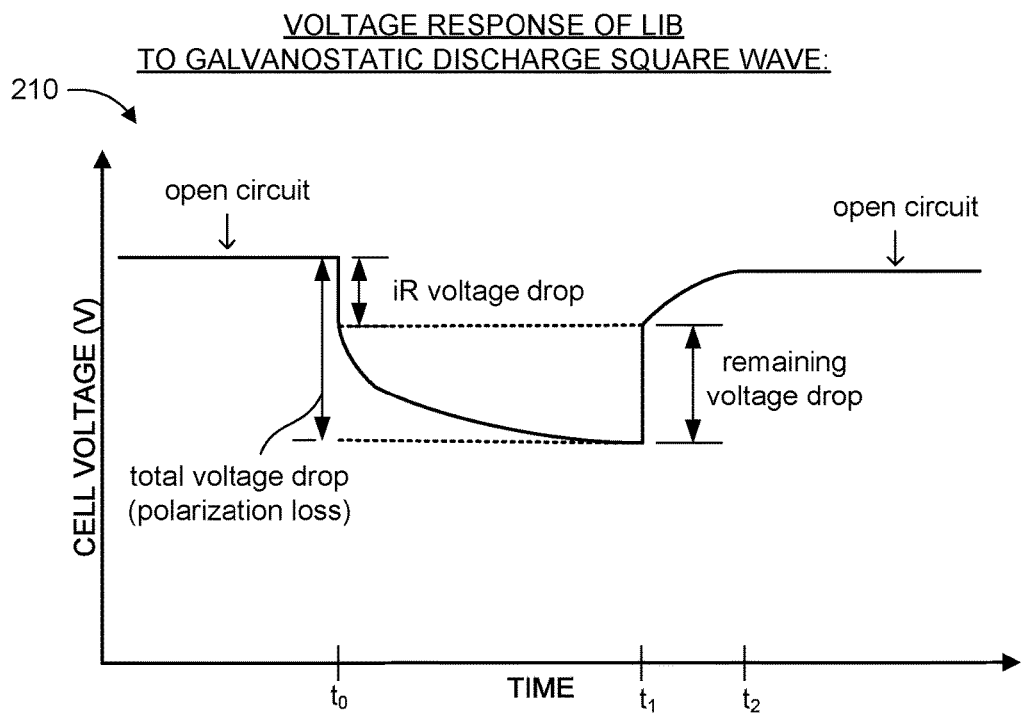
FIG. 5C is an illustration of the timing graph of FIG. 5A depicting the instantaneous voltage change and remaining polarization components of the voltage response profile.
Figure 5D:
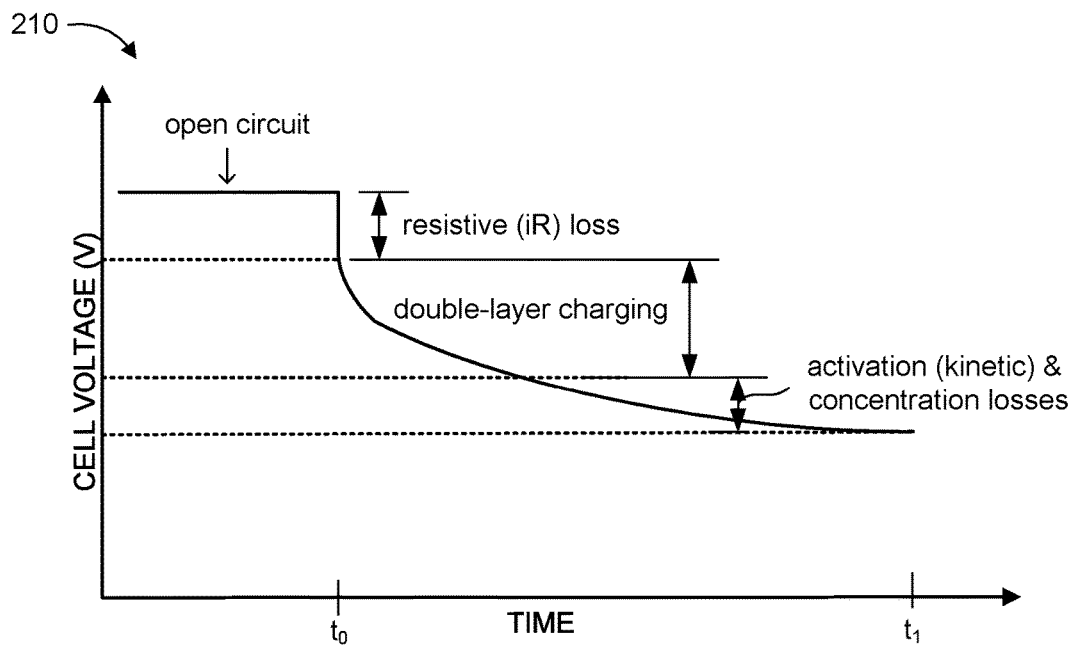
FIG. 5D is an illustration of the timing graph of FIG. 5A depicting the functional form of the voltage response profile.

Reference is now made to FIGS. 5A, 5B, 5C and 5D. FIG. 5A is an illustration of a timing graph, referenced 210, depicting an exemplary voltage response of a LIB to an applied square-wave discharge current, operative in accordance with an embodiment of the present invention. FIG. 5B is an illustration of timing graph 210 depicting different segments of the voltage response profile. FIG. 5C is an illustration of timing graph 210 depicting the instantaneous voltage change and remaining polarization components of the voltage response profile. FIG. 5D is an illustration of timing graph 210 depicting the functional form of the voltage response profile.

The y-axis of graph 210 represents the voltage response of the LIB, while the x-axis represents time. Graph 210 illustrates the effect on a LIB when a resistive load or constant discharge current is applied as a step (square wave) from an open circuit condition, and then released to return to the open circuit condition. The protocol of FIG. 5A results in a functional form of a voltage response that includes: an instantaneous voltage change due to resistive iR losses; a subsequent double-layer charging phase; and a faradaic (charge transfer) reaction phase where the voltage change is due to activation (kinetic) and concentration losses (as seen in FIG. 5D).

Section 211 of the voltage corresponds to the pre-step condition of the LIB. Section 212 represents the voltage once the stimulus is applied, and sections 213 and 214 represent the voltage after the stimulus is released. Similar curves could be obtained when the pre-step condition of the LIB is alternatively one of: a charge, a discharge, or a rest state. The step current protocol corresponds to the LIB condition of being in a constant current charge mode if the initial constant voltage level just prior to the step is a charging voltage. The step stimulus may be either a voltage that is a higher charging current value than the pre-step level, a lower charging current value than the pre-step level, a discharge current, a rest condition, or an open circuit condition.

A number of useful parameters may be extracted from the measured voltage response in the example protocol of graph 210. One example includes the internal resistance of the LIB, which provides information that is useful to detect possible early markers of cell faults such as an SCPC. Other extracted parameters may include the instantaneous drop in voltage when the stimulus is applied and the instantaneous rise in voltage when the current step stimulus is released, which is referred to as the "iR drop". The iR drop provides a value for the overall internal resistance of the LIB. The resistance of the iR drop is calculated by dividing the instantaneous voltage change by the value of the current step. When the stimulus step is released, there is a recovery iR drop that represents the overall internal resistance of the cell during the stimulus application rather than during the pre-stimulus condition.

Further examples of extracted parameters relate to the surface area and the composition of the electrode surface in a LIB. The overall measured double layer capacity is a function of the electrode surface area and its composition. The surface area and composition of electrodes are expected to change due to deposition of lithium dendrites on electrodes. Thus, the variation in the double layer capacity reflects the progression of fault conditions such as an SCPC.

The double layer capacity may be calculated from the voltage transient in the region marked as "double-layer charging" in FIG. 5D (typically for relatively low current steps where the system over-potential is low and/or near equilibrium), via the following equation:

$$I = C \, dV/dt \qquad \text{Eqn. 1}$$

where "I" is the value of the current applied during the step, "dV/dt" is the measured slope of the voltage transient in the double layer charging region, and "C" is the calculated double layer capacity which is related to the active surface area. Changes in "C" indicate changes in the active surface area of the cell electrodes. Alternatively, several current steps each at a different current level can be applied and the dV/dt transient measured for each step. The slope of the plot of step currents vs. dV/dt corresponds to "C".

Yet another useful extracted parameter is the "reaction resistance ($R_{rxn}$)" which refers to the remaining polarization of the step after the instantaneous voltage drop and the release of the stimulus. The remaining polarization consists of two main components: concentration polarization losses due to the diffusion of lithium ions in this case, and the kinetics (electron rate transfer kinetics). The voltage change divided by the current stimulus provides the reaction resistance. The reaction resistance will be affected by characteristics of the cell sensitive to the internal short, such as diffusion pathways disturbed by dendrites, changes in the composition of the electrode surface that affect reaction kinetics, and so forth.

In FIG. 5A, the time period Δt2 represents the transition time "$\tau_r$", (also referred to as the RC time constant), which is the time between the start of the step release and the voltage reaching a predetermined steady state. There is a similar "$\tau_a$" period when the step is applied. $\tau_r$ and $\tau_a$ are related to the concentration of electrochemical active species in the cell electrolyte and depend on factors such as: their diffusion constant, the area of the electrode, and the number of electrons involved in the stoichiometric reaction. Since the latter factors should remain constant, changes in them, as indicated by changes in $\tau_r$ and $\tau_a$, can be used to detect basic chemical changes in the cell that could correlate to the onset of cell faults such as SCPC. Via the Sand equation, the dependence is as follows, (where subscript "x" represents either "r" or "a"):

$$\tau_x^{0.5} = \pi^{0.5} nFAD^{0.5} C / 2I \qquad \text{Eqn. 2}$$

where "i" is the transition time, "n" is the number of electrons participating in the reaction, "F" is Faraday's constant, "A" is the area of the electrode interface, "D" is the diffusion coefficient (which in this case is for lithium ions), "C" is the concentration of the lithium ions in the bulk LIB cell electrolyte, and "I" is the applied current.

Yet another useful extracted parameter is the "Tafel constant, $i_o$". The Tafel constant is an electrochemical reaction rate constant useful for evaluating the activity of electrodes and the kinetics of the reaction. The Tafel constant can be calculated from the current step data once the Rrxn is determined by the following equation for low polarization (relatively low current steps or waves):

$$i_o = RT/R rxn F n \qquad \text{Eqn. 3}$$

where "R" is the universal gas constant, "F" is Faraday's Constant, "n" is the number of electrons participating in the reaction stoichiometry, and "T" is temperature in degrees Kelvin. Alternatively, the Tafel constant may be calculated directly from the basic measurements of voltage and current used to derive $R_{rxn}$.

Reference is now made to FIGS. 6A and 6B. FIG. 6A is an illustration of a timing graph, referenced 220, depicting an exemplary potentiostatic step voltage stimulus, operative in accordance with an embodiment of the present invention. FIG. 6B is an illustration of a timing graph, referenced 230, depicting an exemplary current response of a LIB to the applied step voltage stimulus of FIG. 6A, operative in accordance with an embodiment of the present invention. The applied step voltage is established to be large enough to cause an electrochemical reaction in LIB 110. The step voltage corresponds to the LIB being in a constant voltage charge mode if the initial constant voltage level just prior to the step is a charging voltage. The step voltage stimulus may be: a voltage that is a higher charging current value than the pre-step level, a lower charging current value than the pre-step level, a discharge current, a rest condition, or an open circuit condition.

The current response (I) can be described by the known Cottrell equation:

$$I = nFAD^{1/2} C_{bulk} / (\pi \times t)^{1/2} \qquad \text{Eqn. 4}$$

where "F" is Faraday's Constant, "n" is the number of electrons participating in the reaction, "D" is the diffusion coefficient (which in this case is lithium ions), "C" is the bulk concentration of the electroactive species (in this case lithium ions in the electrolyte of the LIB cell), and "A" is the surface area of the electrode interface. As discussed hereinabove, the electrode area will change upon deposition of lithium and/or copper dendrites that can lead to an SCDH, and so the functional form of the current response (the extent of linearity of the current as a function of $t^{-1/2}$), as well as parameters derived from the current response, can be used as an indicator of a short circuit precursor condition.

A useful parameter that may be extracted from the measured current response is the resistance of the LIB, which can be calculated from the instantaneous change in the current divided by the value of the voltage in the step. Another useful parameter is the area of the electrode interface, as changes in its value may be indicative of an SCPC such as the growth of lithium dendrites.

According to an embodiment of the present invention, data collected from the application of the disclosed monitoring method can be aggregated from many users, in order to enhance predictive capabilities for future monitoring sessions, resembling a "crowdsourcing" type model. For example, the aggregated data may be used to identify performance patterns, which may be correlated with extracted and derived parameter values.

In an exemplary scenario, the optimization of a fleet of electric vehicles, as part of a vehicle fleet-wide safety management network, can be achieved using the collected performance (e.g., crowdsourced) data. The collected data may be communicated wirelessly to a central facility, such as via a dedicated wireless transmitter or by interfacing with an existing dedicated wireless communication platform (e.g., the GM OnStar™ service), as made possible by what is commonly referred to as "connected vehicles". The transmission can be implemented over data communication link 128, which may incorporate Wi-Fi, Bluetooth, cellular communication networks, and the like. In another example, the collected performance data may be communicated with at least one data processing unit, in a centralized or de-centralized fashion, such as by using the internet, text messaging services (SMS), social media platforms, and the like. In this manner, the system and method of the present invention may track and analyze battery usage and safety status among all users. The data can be analyzed by segmenting the users into different groups or categories, such as based on common features (e.g., the same type of battery, per fleet of same model cars, per similar usage patterns, geographical areas, and the like). As more statistics are accumulated, the predictive ability can be refined in order to forecast failures at earlier and earlier stages of battery life, to increase the reliability of the forecasts, to improve their accuracy, to reduce variance in the statistics, and so forth. For example, subtle changes in normal battery behavior that were not recognized as significant for safety prediction for a single use case, may eventually be identified as being a marker of failure using the aforementioned crowdsourcing data aggregation and analysis model. It is further noted that the same principles may also be applied to refining data collected from an individual LIB or associated LIB-powered device (i.e., historical performance data over multiple monitoring sessions), in order to enhance future monitoring and detections of potential safety hazards in the same LIB, which may be is referred to as "machine learning". Such machine learning may also be applied to a group of LIBs (or associated devices) with common characteristics.

Figure 7:
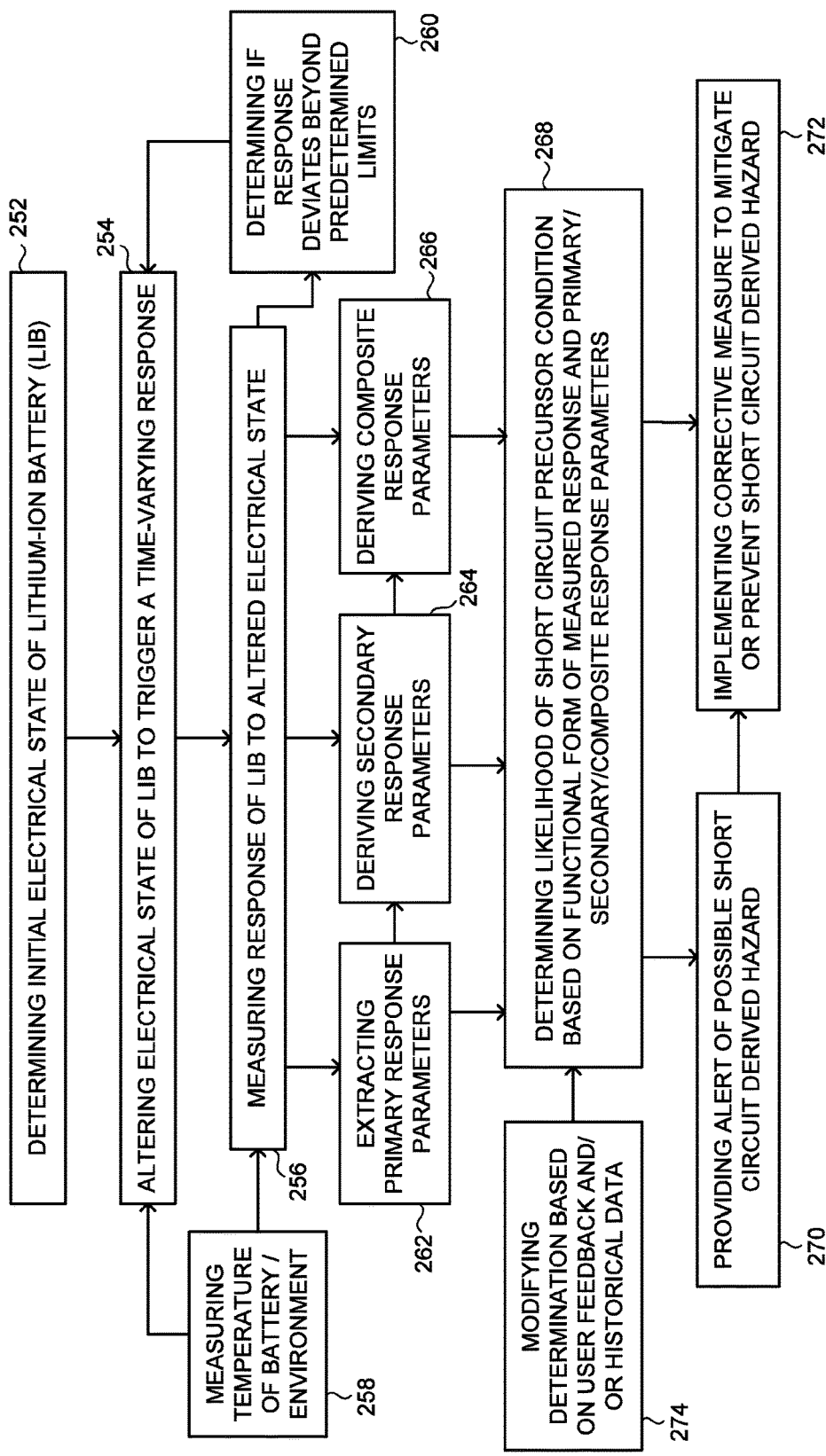
FIG. 7 is a block diagram of a method for monitoring the safety of a LIB, operative in accordance with an embodiment of the present invention.

Reference is now made to FIG. 7, which is a block diagram of a method for monitoring the safety of a LIB, operative in accordance with an embodiment of the present invention. In procedure 252, an initial electrical state of a lithium-ion battery (LIB) is determined. Referring to FIG. 1, response measurement device 114 measures an initial electrical state of LIB 110, such as by determining at least one of: the voltage; the current; whether LIB 110 is in a charging state, a discharging state, an open-circuit state, or a rest state, as well as the SoC or depth of discharge. The initial electrical state of LIB 110 may be determined by real-time measurement, may be provided manually, and/or may be obtained from other sources. For example, system 100 may obtain information relating to the electrical state of LIB 110 from battery parameters stored in data storage unit 124, such as: the cycle number, capacity or state of charge (SoC), and the state of health (SoH).

In procedure 254, the electrical state of the LIB is altered to trigger a time-varying response. Referring to FIG. 1, the initial electrical state of LIB 110 is altered, such as by applying a DC electrical stimulus to LIB 110 by means of stimulus application device 112. For example, stimulus application device 112 may apply a DC current stimulus to LIB 110, or a DC voltage stimulus (such as shown in graphs 190 and 220). The stimulus may be held at a constant level as in a step, or in a time varying mode such as a voltage ramp at a constant or varying rate of change. Further alternatively, LIB 110 may be transitioned into an open-circuit state or into a rest state, from a charging mode or a discharging mode.

For example, stimulus application device 112 may apply a current step stimulus to LIB 110 to cause a temporal voltage response characterized in functional form by at least one of: an instantaneous IR voltage drop, a subsequent double-layer-charging phase, and a subsequent Faradaic reaction phase (as depicted in graph 210). In another example, stimulus application device 112 may apply a voltage scan stimulus to LIB 110 to cause a current response characterized in functional form by at least one of: a low polarization region in which the current is linear with the applied voltage, and a high polarization region in which the natural logarithm of the current is linear with the applied voltage. In yet another example, stimulus application device 112 may apply a voltage step stimulus to LIB 110 to cause a temporal current response characterized by at least one of: an instantaneous change in current; and a subsequent progressive change over time. In yet another example, stimulus application device 112 may apply a voltage scan stimulus to LIB 110 to cause a current response characterized by a functional form of current as function of the applied voltage value. The voltage scan may be linear between two voltages (a start voltage and an end voltage), or cyclic between such voltage limits, in which case at least one cycle between such voltages may be applied. In yet another example, stimulus application device 112 may apply a current scan stimulus (current changing at a constant or non-constant rate as function of time) to LIB 110 to cause a voltage response.

Prior to altering the electrical state of LIB 110, processor 118 may process the information relating to the initial electrical state of LIB 110, and then determine accordingly how to proceed. In particular, processor 118 may determine whether or not to alter the electrical state of LIB 110 at the current point in time, and if so in what manner, such as by modifying the value and/or type of the applied stimulus or altered state. For example, based on the initial electrical state, processor 118 may determine to allow LIB 110 to continue to operate in its existing electrical state, or alternatively to terminate the operation of LIB 110, or further alternatively to change the operating conditions of LIB 110 to different conditions than those that were in effect prior to the initial electrical state.

In procedure 256, the response of the LIB to the altered electrical state is measured. Referring to FIG. 1, response measurement device 114 measures the time-varying response of LIB 110 to the electrical state altering, such as to the applied DC electrical stimulus. For example, response measurement device 114 measures a voltage response profile of LIB 110 to an applied current (as shown in graph 210), or measures a current response profile of LIB 110 to an applied step voltage or voltage scan (as shown in graphs 190 and 230). The measurement includes all features of the response profile, including the functional form or response shape, and the change in the response values over time, particularly with consideration of different segments of the response profile.

In procedure 258, the battery temperature and/or the environmental temperature are measured. Referring to FIG. 1, temperature sensor 116 measures the temperature of LIB 110, such as before, during, and after the monitoring session. In addition, temperature sensor 116 may measure the environmental temperature in the vicinity of LIB 110. System 100 may take into account the measured temperature values in determining how and whether to apply the altered electrical state of LIB 110, and when processing the response data of LIB 110.

In procedure 260, it is determined if the response deviates beyond predetermined limits. Referring to FIG. 1, processor 118 checks the response characteristics (e.g., voltage profile or current profile) of LIB 110 to ascertain whether the response deviates from predetermined operating limits. For example, the LIB voltage may be directed not to exceed approximately 4.1-4.25 volts on charging and not decrease below approximately 2.5-2.75 volts on discharging (e.g., adjusted for cell chemistry, cell design, and manufacturer specifications, all of which may be accessed via data storage unit 124). If the response deviates from predetermined limits, then various measures may be taken, such as: ceasing the applied stimulus and returning LIB 110 to the state it was in prior to the application of the stimulus; transitioning LIB 110 to a different state; or terminating operation of LIB 110.

In procedure 262, primary response parameters are extracted. Referring to FIG. 1, processor 118 analyzes the response of LIB 110 (including the functional form thereof) and extracts an initial set of parameters. For example, depending on the type of applied electrical stimulus, primary response parameters may include the values of the voltage response at different points in time along the various segments of the voltage response, and/or the values of the current response at different points in time along the various segments of the current response. Primary response parameters also include the value of the alteration applied to create the response at times including: prior to, during, and after the response/applied alteration.

It is noted that primary response parameters may be extracted at any point in time spanning the alteration of the electrical state, including for predetermined time periods prior to, during, and/or immediately following the application of the alteration. For example, the data collection period may be chosen to include at least the transitions from pre-alteration period to the altered state period, from the altered state period to post-alteration state, and/or from one altered state to another altered state, as the case may be. Data collection may be implemented for a predetermined number of data recording points (e.g., 300 points overall), or at a fixed rate of data collection (i.e., a set number of points per unit time, such as 10 points per second). Further alternatively, the data collection rate may be linked to a certain change in the measured primary response (e.g., a predetermined change in the voltage or current per recording, such as 1 point for each change of 1 mV or 1 mA).

In addition, the values for the applied stimulus associated for each recorded data point of the primary response parameters may also be recorded. For example, if the stimulus is a current step, then the value of the current is recorded for each data acquisition point of the voltage response. Furthermore, the time (and date) of each collected primary response data point (and associated stimulus parameter) may also be recorded. The timestamp may be represented as, for example: absolute time (i.e., from the start of LIB operation); relative time (i.e., from the start of the monitoring session), or real time (i.e., actual local time independent of the LIB operation). The units of measurement for any type of recorded data can be, for example: predetermined by system 100; adjusted automatically by system 100, and/or established by a user or external source (predetermined or in real-time).

In general, a "primary response parameter" of the present invention may also include any parameter derived by applying at least one mathematical function to a single extracted primary response parameter. Such mathematical functions may be applied in any sequence or combination, including for example at least one of: log, natural logarithm, power, root, inverse, exponent, trigonometric functions (e.g., sine, cosine, tangent, cosine, cotangent), and/or other mathematical functions known in the art.

In procedure 264, secondary response parameters are derived. Referring to FIG. 1, processor 118 derives a second group of parameters from the extracted primary response parameters. For example, if the applied electrical stimulus is a current step, the secondary response parameters may include: the instantaneous voltage drop (iR drop); the resistance of the iR drop; the double layer capacity (C); the time constant for the double layer charging phase (transition time $\tau_r$); a Sand equation parameter (provided in Eqn. 2); the change in the voltage values at the end of the double layer charging regime and the voltage at the end of the applied current step; and the exchange current density ($i_o$).

If the applied electrical stimulus is a voltage scan where the current response is recorded as a log of the current, the secondary response parameters may include: the Tafel slope ($\beta a$ or $\beta c$); the exchange current density ($i_o$); the reaction polarization (Rpol); the current deviation value ($i_d$); the current response as a function of the applied voltage, and parameters derived therefrom.

If the applied electrical stimulus is a voltage scan where the current response is recorded as a function of the applied voltage, the secondary response parameters may include, for example: derivatives and second order derivatives of the voltage-current functional form of the scan; derivatives of the current value at a functional feature of the scan plotted or otherwise taken versus the scan rates or the square root of the scan rate. If the voltage response is plotted as a function of the current directly (rather than the logarithmic current as in graph 190), then additional parameters may be derived from the following Randles-Sevcik equation:

$$i_f = 269 n^{3/2} A D^{1/2} v^{1/2} C \qquad \text{Eqn. 5,}$$

where: "$i_f$" is the current value at a functional feature of the scan; "n" is the number of electrons participating in the reaction; "A" is the geometric surface area of the electrode interface; "D" is the diffusion coefficient of the electroactive species (in this case, lithium ions); "v" is the scan rate; and "C" is the bulk concentration of the electroactive species in the electrolyte (in this case, lithium salt). The scan may be cyclic between two voltage limits, and run at least once between the limits.

If the applied electrical stimulus is a current scan, the secondary response parameters may include, for example: voltage, the voltage response as a function of the applied current, and parameters derived therefrom.

If the applied electrical stimulus is a potential step, the secondary response parameters may include: the instantaneous current change; a resistance value; and changes in the active area of LIB electrodes (via Eqn. 4).

It is noted that processor 118 may utilize various line fitting methods (e.g., stored in data storage unit 124) in performing calculations, such as for deriving relevant parameters. The selection of the line fitting method can be pre-determined, or based on an analysis of the primary response parameters.

In general, a "secondary response parameter" of the present invention may also include any parameter derived by applying mathematical operations to multiple parameters, such as to any combination of at least one primary response parameter and at least one stimulus parameter). Such mathematical operations may be applied in any sequence or combination, including for example: derivative with respect to time or a different primary response parameter, integrals, second or higher level derivative with respect to time or a different primary response parameter, linear regression of the functional form of the response to the altered electrical state, division, multiplication, subtraction, addition, curve fitting including polynomial curve fitting, and other mathematical operations known in the art. Secondary parameters may also result from the combination of a secondary parameter with a mathematical, physical, or chemical constant or coefficient.

In procedure 266, composite response parameters are derived. Referring to FIG. 1, processor 118 derives a third group of parameters from the extracted primary parameters and the derived secondary parameters, such as by applying at least one mathematical operation on some combination of the extracted primary parameters and the derived secondary parameters. Examples of the composite parameters include: $Id/Rrxn$, $1/\beta \times 1/Rrxn$, $Rpol/R$ of the iR drop, $i_o/Rrxn$, $i_o/Rpol$, $i_d/Rpol$, $1/R$ of the iR drop$\times 1/Rpol$, $1/Rrxn \times 1/R$ of the iR drop, $1/Rrxn \times 1/Rpol$, $i_o \times 1/\beta$, $i_d \times 1/\beta$, $\beta/Rrxn$, $\beta/Rpol$, $\beta/R$ of the iR drop, $\beta/i_o$, $\beta/i_d$, $i_d \times Rpol$, $i_o \times Rpol$, $1/\beta \times 1/R$ of the iR drop, $1/\beta \times 1/Rpol$.

In procedure 268, the likelihood of a short circuit precursor condition is determined based on the functional form of the measured response, and the primary, secondary, and/or composite response parameters. Referring to FIG. 1, processor 118 determines the likelihood of an early stage of a short circuit in LIB 110 (i.e., a "short circuit precursor condition"), in accordance with the collected information derived from the time-varying response of LIB 110 to the altered state, including some combination of the primary, secondary and composite response parameters.

The determined likelihood takes into account pertinent information relating to the response profile, such as the functional form of the response, and the rate of change in the primary, secondary, and composite response parameters over time, such as to indicate trends that could project the likelihood of a SCPC at an earlier stage than may be possible based only on the value of the parameters. In other words, the changes in various response parameters may be used to indicate tendencies for the development of certain SCPCs, where such tendencies may not be apparent otherwise. Processor 118 may determine suitable metrics using the collected information, from which the likelihood of a SCPC may be determined.

It is noted that processor 118 may also take into account the consistency between the primary parameters, the secondary parameters, and the composite parameters (i.e., within the same category of parameters and/or between different categories), for determining the likelihood of the SCPC. Such a consistency analysis may help to reduce false positive or false negative detections. The SPCP prediction may vary significantly depending on which particular (primary/secondary/composite) parameters are being considered. For example, out of a group of five parameters, four parameters may indicate a substantially high likelihood of a SCPC whereas the fifth parameter may indicate a much lower likelihood. Therefore, if only the fifth parameter is taken into account, it may result in a false negative determination. Accordingly, processor 118 may utilize the aggregate result of the SCPC likelihood derived from an analysis of a plurality of response parameters. Furthermore, processor 118 may search for additional response parameters in order to verify or refine the SPCP likelihood prediction based on the confidence level of an initial prediction.

In procedure 270, an alert of a potential short circuit derived hazard is provided. Referring to FIG. 1, if processor 118 determines that a short circuit precursor condition in LIB 110 is sufficiently likely, such as according to a predetermined probability level (e.g., at least 50%), then notification unit 120 is directed to provide an alert or warning. For example, notification unit 120 provides a visual indication (e.g., displaying text, markings and/or symbols; changing colors of graphical info) and/or audio indication (e.g., alarms, beeps), indicating that a LIB 110 may soon undergo an SCDH (e.g., combustion event, self-discharging, or a dormant benign state) following the detected SCPC. Notification unit 120 may also communicate the alert to a remote location via data communication link 128.

In procedure 272, at least one corrective measure is implemented to mitigate or prevent a short circuit derived hazard. Referring to FIG. 1, if processor 118 determines that a short circuit precursor condition in LIB 110 is sufficiently likely, such as according to a predetermined probability level (e.g., at least 50%), then safety protocol unit 122 is directed to implement at least one corrective measure. For example, safety protocol unit 122 may electrically isolate a problematic LIB cell from other cells of LIB 110, or may automatically prevent charging of LIB 110. For another example, safety protocol unit 122 may immediately cool at least a portion of LIB 110, such as by applying a fluid-based or air-based cooling mechanism, and/or venting hot gases away from LIB 110. System 100 may also cease the operation of the component (e.g., electronic device or system) that LIB 110 is currently powering, and notify a supervisor (e.g., in the vicinity of LIB 110 or at a remote location) to provide further evaluation of LIB 110 so as to ascertain or confirm the likelihood of a potential SCDH. Further corrective measures endeavor to actually eliminate the short circuit, such as by applying a specific discharge voltage to a LIB identified with lithium-plating derived SCPC, the application of which strips (oxidizes) at least a portion of the lithium plating.

In procedure 274, the determination of a short circuit precursor condition is modified based on user feedback or historical data. Referring to FIG. 1, processor 118 may take into account user instructions, as well as aggregated historical data accumulated from previous monitoring sessions and/or multiple users, in determining the likelihood of a short circuit precursor condition. For example, a user may provide specific instructions (via user interface 126) to apply a "more conservative safety metric", such that the SCPC is established at a lower probability than would otherwise (e.g., if previously a 50% likelihood was applied, then it may now be lowered to 40% or 30%). Alternatively, a user may instruct to apply a higher probability level for establishing an SPCP, such that if previously a 50% likelihood was applied, then it may now be raised to 60% or 70%. Moreover, data storage unit 124 may include stored information associated with previous monitoring sessions of various types of LIBs (including LIB 110 itself). Processor 118 may take into account pertinent stored information, such as to raise or lower the probability for establishing an SCPC based on actual results of similar LIBs characterized by similar response profiles (e.g., whether certain conditions actually resulted in an SCDH event, and/or under what state an SCDH actually occurred in such LIBs). The stored information may be obtained or updated by artificial intelligence techniques used to automatically learn the characteristics of different LIBs based on the historical data, as well as optimal techniques for applying the data to future monitoring sessions. Processor 118 may also take into account certain historical performance data collected from an individual LIB in order to enhance future monitoring and determination of potential short circuit derived hazards in the same LIB (i.e., using a "machine learning" approach).

Figure 8:
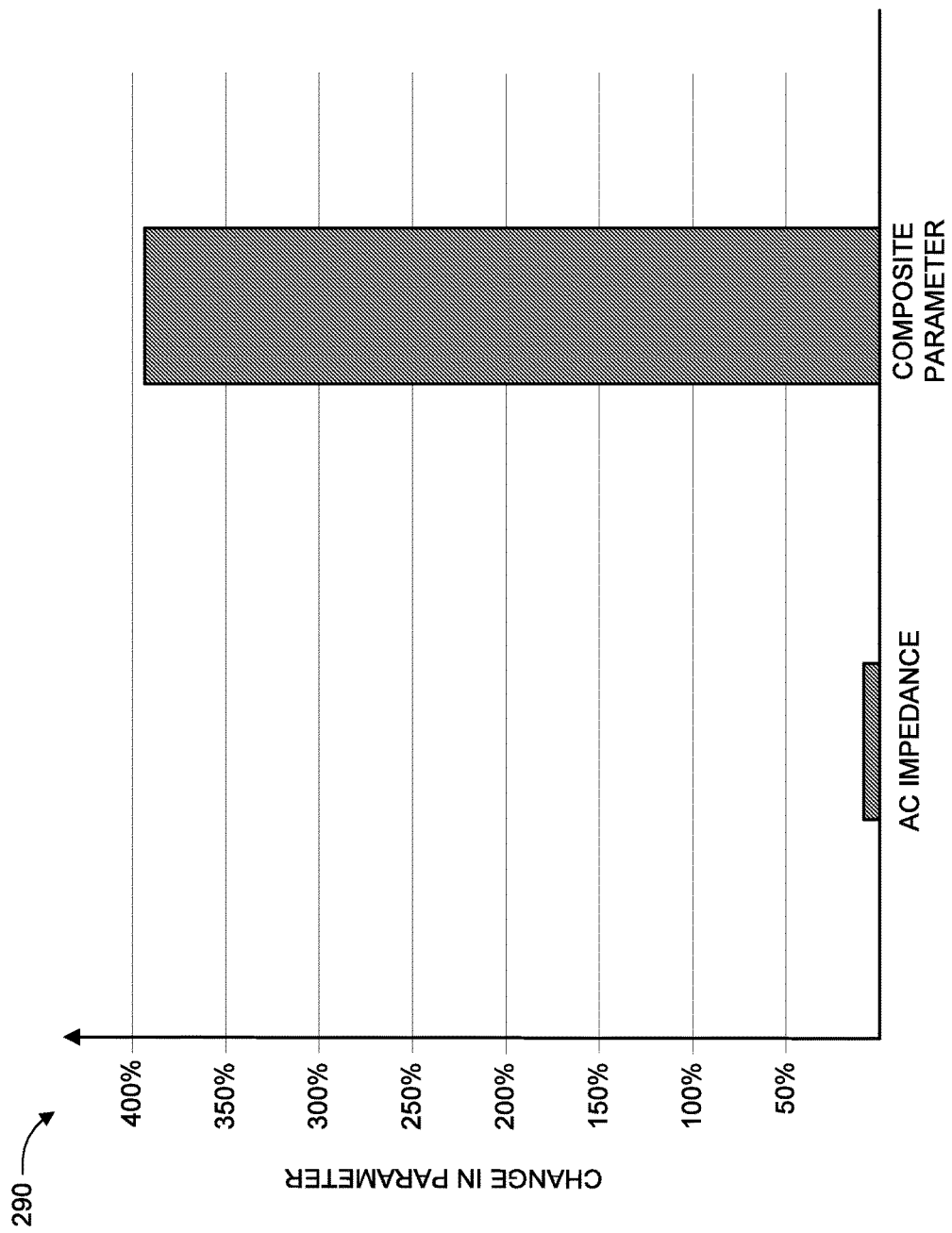
FIG. 8 is an illustration of a bar graph comparing the utility of two different types of parameters for detecting changes in internal resistance of a monitored LIB.

Reference is now made to FIG. 8, which is an illustration of a bar graph, generally referenced 290, comparing the utility of two different types of parameters for detecting changes in internal resistance of a monitored LIB. Graph 290 compares the percentage change in the two parameters when the internal resistance as measured by AC impedance at 1 kHz of an 18650-model LIB (nominal capacity 2.6 amp-hours) at ambient temperature changes from 57 mΩ to 55 mΩ at two different states of charge. The first parameter is AC impedance, and the second parameter is an exemplary composite parameter derived according to the present invention: $i_d \times 1/\beta a$. The change in AC impedance is approximately 4%. The AC impedance is taken as a proxy for the development of an internal short circuit. Using the 57 mΩ as a reference value, the 2 mΩ decrease in internal cell resistance represents an internal short circuit resistance of about 1.5Ω (since the internal short resistance can be viewed as in parallel to the overall cell resistance). At such a low short resistance, thermal runaway could be expected to initiate almost immediately. In contrast, the composite parameter ($i_d \times 1/\beta a$) exhibits an approximately 390% change under the same conditions. For a change of about 1% in AC impedance, indicative of an internal short resistance of about 25Ω, the same composite parameter changed by approximately 175% (not shown in graph 290). Thus, the exemplary composite parameter provides much greater sensitivity (to internal resistance changes, and thus to early detection of a SCPC) in comparison to the AC impedance parameter. Even at relatively high internal short circuit resistance values such as 25Ω, when the LIB has not yet reached a state of imminent thermal runaway, the exemplary composite parameters exhibits far greater sensitivity, permitting the implementation of corrective actions at much earlier stages so as in order to mitigate or prevent SCDHs.

It will be appreciated that the disclosed method of the present invention is an active (i.e., non-passive) technique, in that it involves stimulating or altering the LIB in a specific manner in order to elicit specific responses that provide useful information for allowing early detection and warning of a potential short circuit derived hazard. The warning may be provided before the onset of a (benign) internal short circuit in the LIB, and as a result, a corrective action may be implemented in time to effectively mitigate or prevent the short circuit derived hazard, such as a combustion event. The disclosed method identifies markers that may be particularly sensitive and pertinent for detecting developing internal short circuits in the monitored LIB. The disclosed method may also utilize existing wiring and electronic infrastructure for implementation, without requiring additional dedicated hardware components such as added sensors, wiring and hardware for passive monitoring of the LIB. As a result, the disclosed method may be relatively inexpensive, and easy to install, maintain and upgrade, and does not necessitate additional weight or volume. Moreover, the disclosed method may provide for automated monitoring, and the monitoring can be applied to a single LIB cell or a plurality of LIB cells or cell modules, whether such cells or modules are connected in series and/or in parallel. Yet furthermore, the disclosed method may be implemented on multiple platforms and various LIB types/designs/configurations, providing versatility and flexibility. The disclosed methods may be embedded into semiconductor integrated circuit chips such as microprocessors and ASIC chips, and/or incorporated into software in existing instruments or components that check, manage or monitor LIB, including but not limited to: chargers (wired or wireless), charging stations, power adapters (wired or wireless), battery management systems, electronic control units, computers, and the like.

The disclosed method of the present invention may be embedded into a dedicated ASIC device (single chip/multiple chips/microprocessor(s)) or other integrated circuit or printed circuit or semiconductor device. The disclosed method may also be incorporated into the software or any computer or electronic readable medium used to operate or manage the operation and the safety of the LIB. The disclosed method may also be incorporated into: instruments that test, measure or cycle LIBs, instruments used during the LIB manufacturing process, potentiostats, galvanostats, QA/QC equipment, and the like.

The present invention is applicable to battery safety monitoring in a wide variety of applications. In particular, the disclosed safety monitoring method may be applied to any lithium-ion battery powered device, product or system in any technical field, including but not limited to: consumer electronics (e.g., mobile phones; laptop computers; tablet computers; e-book readers; smart-watches or other wearable electronic products; and the like), vehicles (e.g., aircrafts; land vehicles; electric trains; electric-vehicles (EVs), including pure EVs, hybrids and plug-ins; electric buses; electric carts; electric wheel chairs; electric heavy equipment including forklifts; electric boats and submarines and other marine vessels, electric-bicycles (e-bikes); electric-scooters (e-scooters), UAV drones); communication devices (e.g., radios, two-way radios, receivers, transmitters, transceivers, and the like), electrical equipment (e.g., power tools; electronic cigarettes (e-cigs); medical devices, including implantable devices, and facilities for energy storage (e.g., charging stations, grid energy storage systems, solar panel energy storage, wind turbine energy storage, hydroelectric and wave and tidal energy storage; satellites.

Moreover, the safety monitoring method of the present invention may also be extended to non-battery applications that use electrical stimuli, such as biomedical applications, as well as non-electric stimuli, such as pneumatic applications (e.g., air valves, airflow) and fluid systems (e.g., oil systems and water utilities).

While certain embodiments of the disclosed subject matter have been described, so as to enable one of skill in the art to practice the present invention, the preceding description is intended to be exemplary only. It should not be used to limit the scope of the disclosed subject matter, which should be determined by reference to the following claims.

The invention claimed is:

1. A method for monitoring the safety of a rechargeable Li-ion battery (LIB), the method comprising the procedures of:
    measuring, using a response measurement device, a cell operating parameter of said LIB;
    determining an initial electrical state of said LIB based on the cell operating parameter;

altering the electrical state of said LIB by the application or removal of a direct current (DC) electrical stimulus to said LIB, using a stimulus application device, so as to trigger a time-varying response;

measuring, using the response measurement device, the time-varying response of said LIB to the altered electrical state;

extracting at least one primary response parameter associated with at least the functional form of the measured response;

deriving at least one secondary response parameter from said primary response parameter;

determining a likelihood of a short circuit precursor condition, in accordance with at least one of: said primary response parameter; and said secondary response parameter, wherein said primary response parameter includes at least one of voltage response values at different times, current response values at different times, and parameters relating to the electrical state altering; and providing an alert of a potential short circuit derived hazard, in accordance with the determined likelihood of a short circuit precursor condition.

2. The method of claim 1, further comprising the procedure of:

deriving at least one composite response parameter from said primary response parameter and from said secondary response parameter;

wherein said likelihood of a short circuit precursor condition is further determined in accordance with said composite response parameter.

3. The method of claim 1, further comprising the procedure of implementing at least one corrective measure to mitigate or prevent a short circuit derived hazard, in accordance with the determined likelihood of a short circuit precursor condition.

4. The method of claim 1, wherein said procedure of altering the electrical state of said LIB comprises the application of at least one electrical stimulus selected from the list consisting of:

a discharging voltage;
a charging voltage;
a potentiostatic voltage;
a linearly varying voltage;
a discharging current;
a charging current;
a galvanostatic current;
a linearly variable current;
a discharging resistive load;
a discharging constant power;
a charging constant power; and
any combination of the above.

5. The method of claim 1, wherein said procedure of altering the electrical state of said LIB comprises at least one operation selected from the list consisting of:

switching said LIB to an open-circuit state or rest state from a discharging state;

switching said LIB to an open-circuit or rest state from a charging state;

switching said LIB to a charging state from an open-circuit state or a discharging state or a rest state;

switching said LIB to a discharging state from an open-circuit state or a charging state or a rest state; and any combination of the above.

6. The method of claim 1, wherein said procedure of altering the electrical state of said LIB comprises the application of a step current to trigger a voltage response characterized by at least one response portion selected from the list consisting of: i) an instantaneous voltage change; ii) a double-layer charging phase; and iii) a Faradaic reaction phase.

7. The method of claim 1, wherein said procedure of altering the electrical state of said LIB comprises the application of a linear voltage scan to trigger a current response characterized by at least one response portion selected from the list consisting of: i) a linear dependence region of current on voltage at low polarization; and ii) a logarithmic dependence region of current on voltage at high polarization.

8. The method of claim 1, wherein said secondary response parameter is selected from the list consisting of:

instantaneous voltage drop (iR drop);
resistance of the iR drop;
double layer capacity (C);
time constant for the double layer charging or discharging phase (transition time $\tau_r$);
Sand equation parameters;
change in voltage during double layer charging or discharging;
change in voltage during the Faradaic reaction phase of the applied current step;
reaction resistance (Rrxn);
exchange current density ($i_o$);
Tafel slope ($\beta a$ or $\beta c$);
reaction polarization (Rpol);
current deviation value ($i_d$);
current response as a function of applied voltage;
derivatives and second order derivatives of a voltage-current functional form of a voltage scan;
derivatives of current value;
Randles-Sevcik equation parameters;
voltage response as a function of applied current;
instantaneous current change;
resistance value of the instantaneous current change;
Cottrell equation parameters; and
changes in active area of LIB electrodes.

9. The method of claim 1, further comprising the procedure of measuring a temperature associated with said LIB, wherein said procedure of altering the electrical state of said LIB, and said procedure of measuring the time-varying response of said LIB, takes into account the measured temperature.

10. The method of claim 1, further comprising the preliminary procedure of determining at least one authenticating feature of said LIB, wherein implementing said method procedures is conditional on said authenticating feature.

11. The method of claim 1, wherein said procedure of altering the electrical state of said LIB comprises the application of a step voltage to trigger a current response.

12. A system for monitoring the safety of a rechargeable Li-ion battery (LIB), the system comprising:

a stimulus application device, configured to alter the electrical state of said LIB by the application or removal of a direct current (DC) electrical stimulus to said LIB so as to trigger a time-varying response;

a response measurement device, configured to measure a cell operating parameter of the LIB for determining an initial electrical state of the LIB, and further configured to measure the time-varying response of said LIB to the altered electrical state;

a processor, coupled with said response measurement device, said processor configured to extract at least one primary response parameter associated with at least the functional form of the measured response, further configured to derive at least one secondary response parameter from said primary response parameter, and to determine a likelihood of a short circuit precursor condition, in accordance with at least one of said primary response parameter; and said secondary response parameter, wherein said primary response parameter includes at least one of voltage response values at different times,
current response values at different times, and
parameters relating to the electrical state altering; and a notification unit, configured to provide an alert of a potential short circuit derived hazard, in accordance with the determined likelihood of a short circuit precursor condition.

13. The system of claim 12, wherein said processor is configured to determine said likelihood of a short circuit precursor condition further in accordance with the rate of change of at least one of: said primary parameter; and said secondary parameter; and said composite parameter.

14. The system of claim 12, further comprising a safety protocol unit, configured to implement at least one corrective measure to mitigate or prevent a short circuit derived hazard, in accordance with the determined likelihood of a short circuit precursor condition.

15. The system of claim 12, wherein said stimulus application device is configured to apply a step current to trigger a voltage response characterized by at least one response portion selected from the list consisting of: i) an instantaneous voltage change; ii) a double-layer charging phase; and iii) a Faradaic reaction phase.

16. The system of claim 12, wherein said stimulus application device is configured to apply a linear voltage scan to trigger a current response characterized by at least one response portion selected from the list consisting of: i) a linear dependence region of current on voltage at low polarization; and ii) a logarithmic dependence region of current on voltage at high polarization.

17. The system of claim 12, further comprising at least one temperature sensor, configured to measuring a temperature associated with said LIB, wherein said stimulus application device is configured to alter the electrical state of said LIB in accordance with the measured temperature, and wherein said response measurement device is configured to measure the time-varying response of said LIB in accordance with the measured temperature.

18. The system of claim 12, wherein said stimulus application device is configured to apply a step voltage to trigger a current response.

* * * * *